(12) United States Patent
    Choudhury et al.

(10) Patent No.:  US 12,683,550 B2
(45) Date of Patent:       Jul. 14, 2026

(54) METHODS AND APPARATUS TO TRACK AN OSCILLATOR FREQUENCY WITH DIGITAL FILTERS

(71) Applicant: Texas Instruments Incorporated, Dallas, TX (US)

(72) Inventors: Anurag Choudhury, Bengaluru (IN); Robin Hoel, Oslo (NO); Torjus Lyng Kallerud, Oslo (NO); Ashutosh Mishra, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/946,419

(22) Filed: Nov. 13, 2024

(65) Prior Publication Data

US 2026/0135513 A1     May 14, 2026

(51) Int. Cl.
    *H03B 5/04*              (2006.01)

(52) U.S. Cl.
    CPC ....... *H03B 5/04* (2013.01); *H03B 2200/0054* (2013.01); *H03B 2202/02* (2013.01)

(58) Field of Classification Search
    CPC ..................................................... H03B 5/04
    USPC ......................................................... 331/175
    See application file for complete search history.

(56) References Cited

U.S. PATENT DOCUMENTS 8,532,243 B2 *   9/2013   Seethamraju ............. G06F 1/04
                                                              375/372
9,941,891 B2 *   4/2018   Chen ...................... H03L 7/099

* cited by examiner

*Primary Examiner* — Joseph Chang
(74) *Attorney, Agent, or Firm* — Carl G. Peterson; Frank D. Cimino

(57)                    ABSTRACT

An example apparatus includes: first oscillator circuitry; second oscillator circuitry; period calculator circuitry coupled to the first oscillator circuitry and coupled to the second oscillator circuitry; averaging circuitry coupled to the period calculator circuitry; and coefficient filter circuitry coupled to the averaging circuitry.

20 Claims, 11 Drawing Sheets

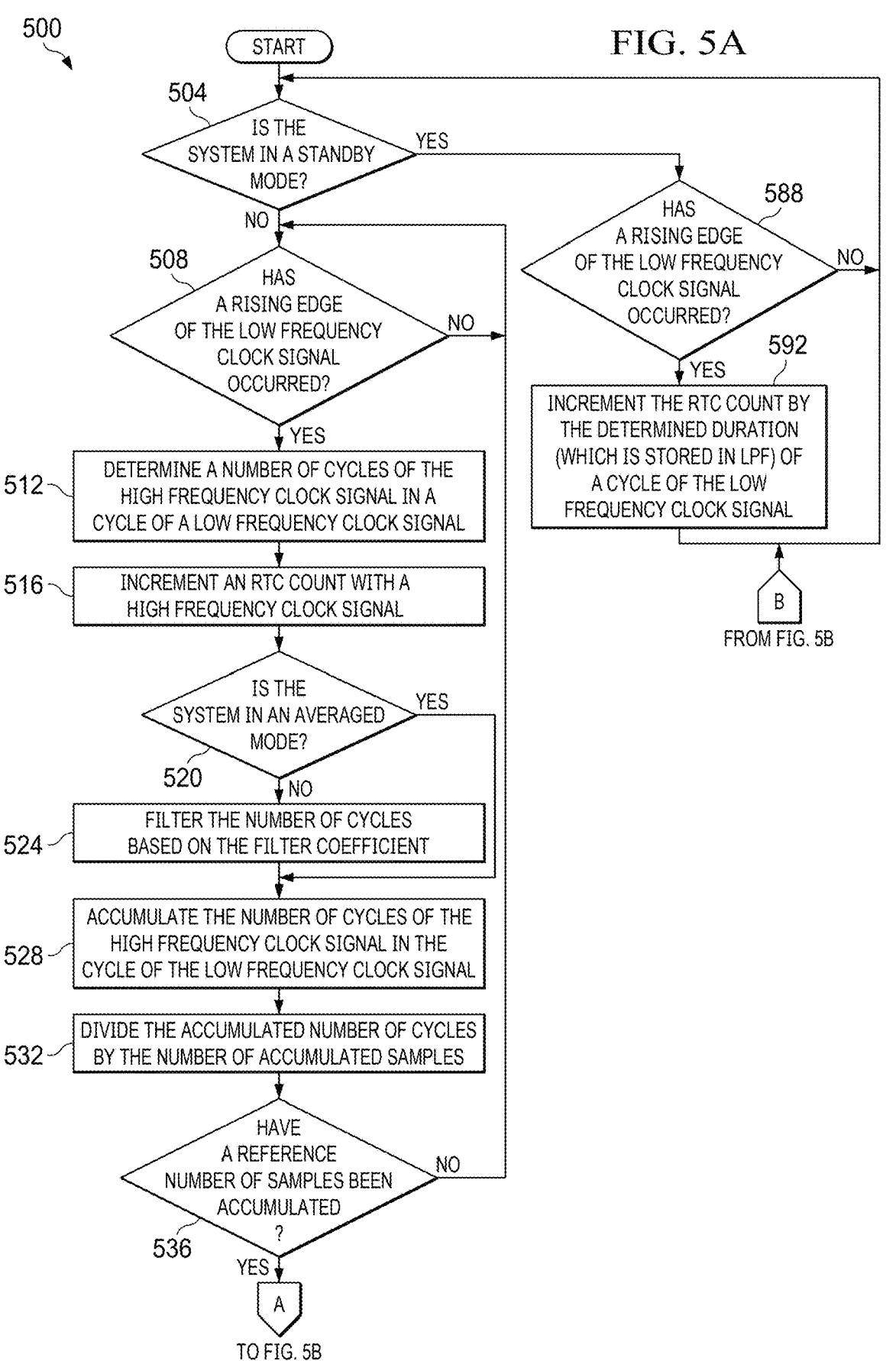

START

504
IS THE SYSTEM IN A STANDBY MODE?
YES
NO

508
HAS A RISING EDGE OF THE LOW FREQUENCY CLOCK SIGNAL OCCURRED?
NO
YES

512
DETERMINE A NUMBER OF CYCLES OF THE HIGH FREQUENCY CLOCK SIGNAL IN A CYCLE OF A LOW FREQUENCY CLOCK SIGNAL

516
INCREMENT AN RTC COUNT WITH A HIGH FREQUENCY CLOCK SIGNAL

IS THE SYSTEM IN AN AVERAGED MODE?
YES
520
NO

524
FILTER THE NUMBER OF CYCLES BASED ON THE FILTER COEFFICIENT

528
ACCUMULATE THE NUMBER OF CYCLES OF THE HIGH FREQUENCY CLOCK SIGNAL IN THE CYCLE OF THE LOW FREQUENCY CLOCK SIGNAL

532
DIVIDE THE ACCUMULATED NUMBER OF CYCLES BY THE NUMBER OF ACCUMULATED SAMPLES

536
HAVE A REFERENCE NUMBER OF SAMPLES BEEN ACCUMULATED?
NO
YES

A
TO FIG. 5B

588
HAS A RISING EDGE OF THE LOW FREQUENCY CLOCK SIGNAL OCCURRED?
NO
YES

592
INCREMENT THE RTC COUNT BY THE DETERMINED DURATION (WHICH IS STORED IN LPF) OF A CYCLE OF THE LOW FREQUENCY CLOCK SIGNAL

B
FROM FIG. 5B

METHODS AND APPARATUS TO TRACK AN OSCILLATOR FREQUENCY WITH DIGITAL FILTERS

TECHNICAL FIELD

This description relates generally to frequency tracking and, more particularly, to methods and apparatus to track an oscillator frequency with digital filters.

BACKGROUND

Oscillator circuitry generates a periodic signal, which is capable of sequencing increasingly advanced operations. In some systems, counting cycles of an oscillator signal provides a real-time clock (RTC) count representing the passage of time. In communication systems, oscillator signals provide a basis for initiating and performing wireless communications. Oscillator circuitry drives an increasing number of operations across an increasingly wide range of operating conditions.

SUMMARY

For methods and apparatus to track an oscillator frequency with digital filters, an example apparatus includes first oscillator circuitry; second oscillator circuitry, period calculator circuitry coupled to the first oscillator circuitry and coupled to the second oscillator circuitry, averaging circuitry coupled to the period calculator circuitry, and coefficient filter circuitry coupled to the averaging circuitry. Other examples are described.

For methods and apparatus to track an oscillator frequency with digital filters, an example apparatus includes period calculator circuitry including an output; averaging circuitry including an output and coupled to the output of the period calculator circuitry, noise detection circuitry coupled to the output of the averaging circuitry, and coefficient filter circuitry coupled to the noise detection circuitry. Other examples are described.

For methods and apparatus to track an oscillator frequency with digital filters, an example apparatus includes period calculator circuitry configured to determine a number of cycles of a first signal in a period of a second signal; averaging circuitry coupled to the period calculator circuitry and configured to determine an average of the number of cycles of the first signal in a plurality of periods of the second signal, and coefficient filter circuitry coupled to the averaging circuitry and configured to filter the average of the number of cycles of the first signal based on a filter coefficient. Other examples are described.

BRIEF DESCRIPTION OF THE DRAWINGS

FIGS. 5A and 5B form a flowchart representative of example machine-readable instructions or example operations that may be at least one of executed, instantiated, or performed using an example implementation of the frequency tracking circuitry of FIGS. 1, 2, 3, and 4, or more generally the SoC of FIG. 1.

Figure 1:
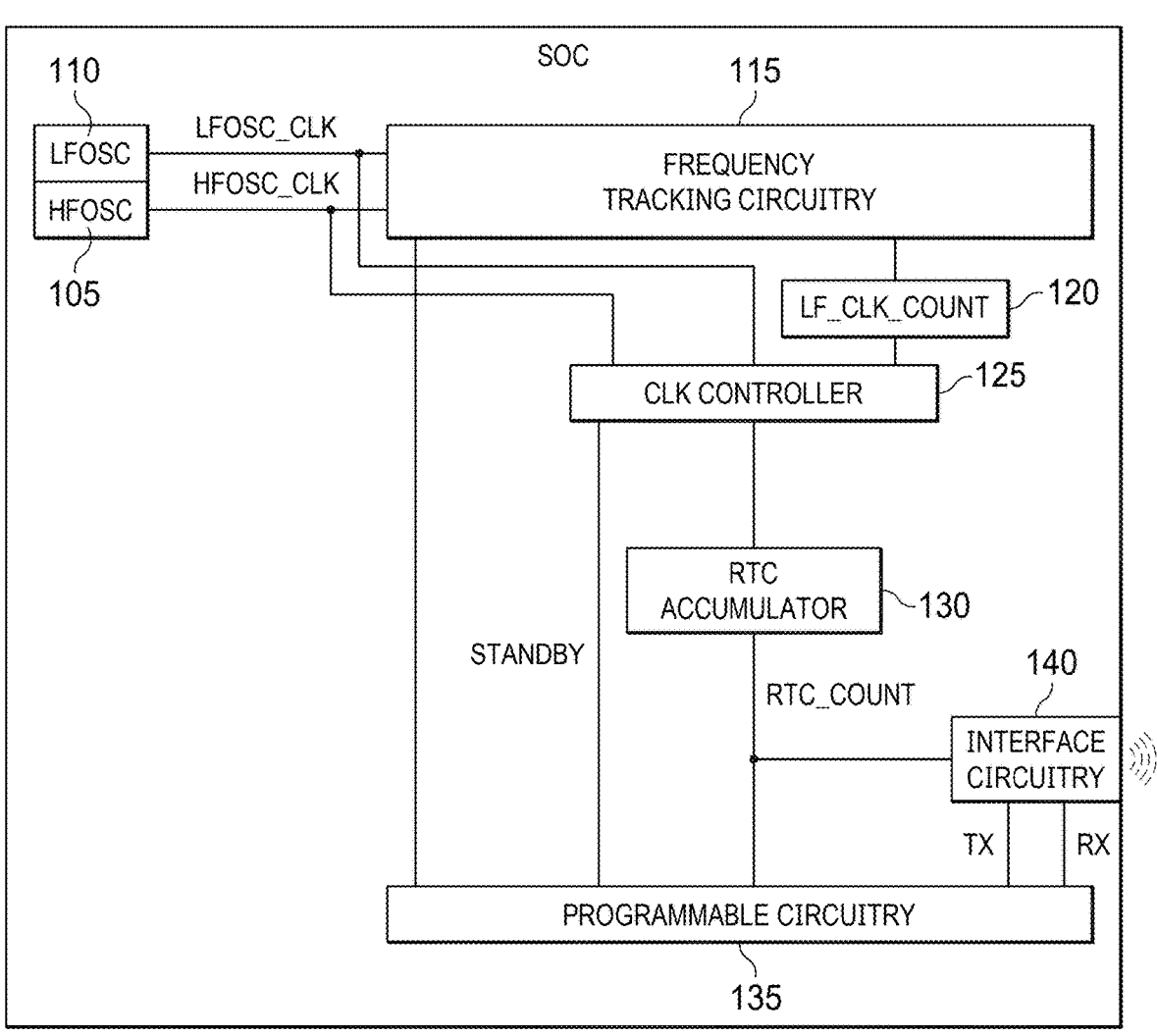
FIG. 1 is a block diagram of an example system-on-chip (SoC) including example frequency tracking circuitry.

The drawings are not necessarily to scale. Generally, the same reference numbers in the drawing(s) and this description refer to the same or similar (functionally and/or structurally) features and/or parts. Although the drawings show regions with clean lines and boundaries, some or all of these lines and boundaries may be idealized. In reality, the boundaries or lines may be unobservable, blended or irregular.

DETAILED DESCRIPTION

Oscillator circuitry generates a periodic signal that may be utilized to sequence advanced operations. In some systems, accumulating a count of cycles of an oscillator signal provides a real-time clock (RTC) count representative of the passage of time. In communication systems, oscillator signals provide a basis for initiating and performing wireless communications. Oscillator circuitry drives an increasing number of operations across an increasingly wide range of operating conditions.

Precision systems rely on oscillator circuitry to provide precision oscillator signals across a wide range of operating conditions. Some oscillator circuitry uses an external crystal component to generate accurate oscillator signals. Such systems further include clock controller circuitry and RTC accumulator circuitry. The clock controller circuitry increments an RTC count of the RTC accumulator circuitry in response to cycles of the oscillator signal. The RTC count may be used by programmable circuitry to perform time-oriented operations, such as setting triggers for interrupt service routines (ISRs). However, implementing an external crystal component increases cost and system-on-chip (SoC) size of the system. The additional cost and area introduced by external crystal oscillator circuitry has incentivized systems to use on-chip oscillator circuitry whenever possible. Such systems may be referred to as crystal-less systems.

Crystal-less systems replace crystal oscillator circuitry with on-chip oscillator circuitry. The on-chip oscillator circuitry reduces the cost and size associated with including an external crystal component. However, low frequency on-chip oscillator circuitry has higher period jitter and random telegraph noise (RTN) in comparison to systems using crystal oscillators. Period jitter is a shift in a detection of rising and falling edges of the oscillator signal. RTN is a seemingly random shift in the frequency of the oscillator signal resulting from electrons becoming stuck in gates of transistors. In operation, the amount of RTN depends on a series of conditions that vary from chip-to-chip, such as manufacturing variations, process changes, etc. Also, the jitter and standard deviation of frequency shifts from RTN vary based on changes to the oscillator circuitry architecture during run-time, such as deviations from standard pressure and temperature conditions. Although on-chip oscillator circuitry reduces cost and size, changes in frequency responsive to jitter and RTN constrain the use to systems capable of accurately tracking frequency changes.

Some systems that rely on oscillators are power-constrained systems that operate using battery power, such as battery-operated devices. Some power-constrained systems use a standby operating mode to reduce power consumption. In non-standby operating mode (also referred to as normal or sleep operating modes), the clock controller circuitry increments an RTC count based on a high frequency clock signal from high frequency oscillator circuitry. In standby operation, the systems turn off the high frequency oscillator circuitry to reduce power consumption, instead relying on a low frequency clock that consumes less power. Also, in standby operation, the clock controller circuitry continues to increment the RTC count to reflect the passage of time. However, without the high frequency oscillator, the clock controller circuitry increments the RTC count based on the low frequency clock signal. The clock controller circuitry increments the RTC count by a count of cycles of the high frequency clock in a cycle of the low frequency clock signal to replicate the RTC count of the high frequency clock signal. In operation, the clock controller circuitry increments the RTC count by the determined count of cycles based on cycles of the low frequency clock signal from low frequency oscillator circuitry. Consequently, maintaining an accurate determined count is important for a reliable RTC count. As mentioned above, the RTC count can function as a system clock, and the device may use the RTC count for critical features such as the timing of ISRs.

Systems include frequency tracking circuitry to determine the count of cycles of the high frequency clock signal in a cycle of the low frequency clock signal. During the normal operations, the frequency tracking circuitry uses period calculator circuitry to count a number of cycles of the high frequency oscillator signal that transpire during a cycle of the low frequency oscillator signal. The count of cycles represents a ratio of the frequencies of the high frequency oscillator circuitry and the low frequency oscillator circuitry. As such, changes in the frequency of the high or low frequency oscillator signals change the ratio represented by the count. However, jitter and RTN of the low frequency oscillator signal changes the determined count across a plurality of cycles of the low frequency oscillator signal. Also, the low frequency oscillator circuitry is more susceptible to changes in frequency responsive to jitter and RTN in both standby and non-standby operating modes.

Some frequency tracker circuitry includes low pass coefficient filter circuitry to account for changes in the count of cycles across several samples from the period calculator circuitry. The low pass coefficient filter circuitry uses a varying filter coefficient (K) to track changes across multiple samples. In operation, the low pass coefficient filter circuitry uses a relatively high filter coefficient for the first few counts, which allows the frequency tracking circuitry to rapidly respond to changes in frequency of the low frequency oscillator signal. In further operation, the filter coefficient decreases as more counts are determined, which increases the response time of the low pass coefficient filter to changes in the frequency. The low pass coefficient filter circuitry effectively rejects changes in the count as more samples are filtered. However, as rejection of changes to the count increases, the low pass coefficient filter circuitry fails to accurately track extended variations in the frequency of the low frequency clock signal. Such a failure to change the filtered count to reflect extended variations in frequency reduces the accuracy of RTC count during standby operations. In wireless communication systems, failing to reflect extended variations in frequency may prevent interface circuitry from establishing communications after entering normal operation. Similarly, failing to reject changes in the frequency also reduces the accuracy of the RTC count.

Examples described herein include methods and apparatus to track an oscillator frequency with digital filters. In some described examples, frequency tracking circuitry includes period calculator circuitry, averaging circuitry, multiplexer circuitry, coefficient filter circuitry, and noise detection circuitry. The period calculator circuitry produces a count of the number of cycles of the high frequency oscillator signal in a cycle of the low frequency oscillator signal. The count from the period calculator circuitry represents a ratio of the frequencies of high frequency oscillator circuitry and low frequency oscillator circuitry.

In the described examples, the averaging circuitry (also referred to as first filter circuitry) filters the count from the period calculator circuitry by averaging the current count with samples of previously determined counts. The averaging circuitry produces an average count representing the average value of the count from the period calculator circuitry. The noise detection circuitry detects RTN by comparing a count difference between the average count and the previously determined count at the output of the frequency tracking circuitry. The noise detection circuitry detects a change in the low frequency clock signal is due to RTN responsive to the count difference being greater than a noise threshold value. Unlike jitter, which briefly changes the frequency, RTN is capable of changing the frequency of the oscillator signals over a greater amount of time. In some examples, the noise detection circuitry accounts for the RTN by reinitializing the coefficient filter circuitry to the average count from the averaging circuitry. Advantageously, reinitializing the coefficient filter circuitry to the average count improves the response time of the frequency tracking circuitry to changes in the low frequency oscillator signal from RTN. Advantageously, the noise detection circuitry increases the accuracy of the RTC count by reducing the response time to relatively long changes in the frequency of oscillator signals resulting from RTN.

In such described examples, the multiplexer circuitry structures frequency tracking circuitry for one of a first filter mode or a second filter mode. In the first filter mode, the multiplexer circuitry supplies the count from the period calculator circuitry to the coefficient filter circuitry. In such example operations, the coefficient filter circuitry produces a filtered count value responsive to filtering counts from the period calculator circuitry. Advantageously, during the first filter mode operations, the averaging circuitry continues to allow the noise detection circuitry to detect and account for RTN in the frequencies of the oscillator signals.

In the second filter mode, the multiplexer circuitry supplies the average count from the averaging circuitry to the coefficient filter circuitry. In such example operations, the coefficient filter circuitry produces the filtered count value responsive to filtering the average counts. Advantageously, during the second filter operations, both the averaging circuitry and the coefficient filter circuitry filter the counts from the period calculator circuitry. Advantageously, the additional filtering of the averaging circuitry improves the rejection of changes in the count resulting from jitter and high frequency noise. Advantageously, the frequency tracking circuitry described improves the accuracy of the RTC count during standby operations by improving the accuracy of the filtered count value.

FIG. 1 is a block diagram of an example system-on-chip (SoC) 100. The example SoC 100 of FIG. 1 includes first example oscillator circuitry 105, second example oscillator circuitry 110, example frequency tracking circuitry 115, an example clock count circuitry 120, example clock controller circuitry 125, example RTC accumulator circuitry 130, example programmable circuitry 135, and example interface circuitry 140. In the example of FIG. 1, the SoC 100 may be illustrated or described in connection with a wireless communication system. Alternatively, the SoC 100 may be modified for inclusion in other systems.

The oscillator circuitry 105 has an output coupled to the frequency tracking circuitry 115 and the clock controller circuitry 125. In the example of FIG. 1, the oscillator circuitry 105 is a high frequency oscillator, which produces a high frequency oscillator signal (HFOSC_CLK). In the example of communication systems, the oscillator circuitry 105 is structured to produce an oscillator signal having a frequency in the megahertz (MHz).

The oscillator circuitry 110 has an output coupled to the frequency tracking circuitry 115 and the clock controller circuitry 125. In the example of FIG. 1, the oscillator circuitry 110 is a low frequency oscillator, which produces a low frequency oscillator signal (LFOSC_CLK). In the example of communication systems, the oscillator circuitry 110 is structured to produce an oscillator signal having a frequency in the kilohertz (kHz).

The frequency tracking circuitry 115 has a first input, a second input, a third input, and an output. The first input of the frequency tracking circuitry 115 is coupled to the oscillator circuitry 105. The second input of the frequency tracking circuitry 115 is coupled to the oscillator circuitry 110. The third input of the frequency tracking circuitry 115 is coupled to the programmable circuitry 135. The output of the frequency tracking circuitry 115 is coupled to the clock count circuitry 120. Examples of the frequency tracking circuitry 115 are further illustrated and described in connection with FIGS. 2, 3, and 4, below.

The clock count circuitry 120 has a first terminal and a second terminal. The first terminal of the clock count circuitry 120 is coupled to the frequency tracking circuitry 115. The second terminal of the clock count circuitry 120 is coupled to the clock controller circuitry 125. In the example of FIG. 1, the clock count circuitry 120 is structured to store a filtered clock count value (LF_CLK_COUNT) from the frequency tracking circuitry 115 for use by the clock controller circuitry 125 for standby operations.

The clock controller circuitry 125 has a first input, a second input, a third input, a fourth input, and an output. The first input of the clock controller circuitry 125 is coupled to the oscillator circuitry 105 and the frequency tracking circuitry 115. The second input of the clock controller circuitry 125 is coupled to the oscillator circuitry 110 and the frequency tracking circuitry 115. The third input of the clock controller circuitry 125 is coupled to the clock count circuitry 120. The fourth input of the clock controller circuitry 125 is coupled to the programmable circuitry 135. The output of the clock controller circuitry 125 is coupled to the RTC accumulator circuitry 130. Example operations of the clock controller circuitry 125 are illustrated and described in connection with FIGS. 5A and 5B.

The RTC accumulator circuitry 130 has an input and an output. The input of the RTC accumulator circuitry 130 is coupled to the clock controller circuitry 125. The output of the RTC accumulator circuitry 130 is coupled to the programmable circuitry 135 and the interface circuitry 140. In the example of FIG. 1, the RTC accumulator circuitry 130 is structured to accumulate an RTC count to represent the passage of time. Example operations of the RTC accumulator circuitry 130 are illustrated and described in connection with FIGS. 5A and 5B.

The programmable circuitry 135 has a first input, a second input, a first output, a second output, and a third output. The first input of the programmable circuitry 135 is coupled to the RTC accumulator circuitry 130 and the interface circuitry 140. The second input of the programmable circuitry 135 is coupled to the interface circuitry 140. The first output of the programmable circuitry 135 is coupled to the frequency tracking circuitry 115. The second output of the programmable circuitry 135 is coupled to the clock controller circuitry 125. The third output of the programmable circuitry 135 is coupled to the interface circuitry 140. In the example of FIG. 1, the programmable circuitry 135 is structured to instantiate circuitry (e.g., creating an instance of, bring into being for any length of time, materialize, implement, etc.) responsive to an execution of machine-readable instructions. In some examples, the programmable circuitry 135 executes instructions to control operations of the frequency tracking circuitry 115. Example structures of the frequency tracking circuitry 115 are illustrated and described in connection with FIGS. 2, 3, 4, and 5.

The interface circuitry 140 has a first input, a second input, and an output. The first input of the interface circuitry 140 is coupled to the RTC accumulator circuitry 130 and the programmable circuitry 135. The second input and output of the interface circuitry 140 are coupled to the programmable circuitry 135. In the example of FIG. 1, the interface circuitry 140 is a wireless communication interface, which sequences the transmission and reception of signals to/from another device. For example, the interface circuitry 140 may implement Bluetooth low energy (BLE) communication protocols to exchange data between the programmable circuitry 135 and another device.

Example operations of the SoC 100 during both normal and standby operations are further illustrated and described in connection with FIGS. 5A and 5B. Advantageously, the frequency tracking circuitry 115 includes circuitry, which allows the programmable circuitry 135 to configure (e.g., structure, alter, control, etc.) frequency tracking operations. Advantageously, allowing the programmable circuitry 135 to change the structure of the frequency tracking circuitry 115 increases the versatility of frequency tracking operations across a wide range of devices and conditions.

Figure 2:
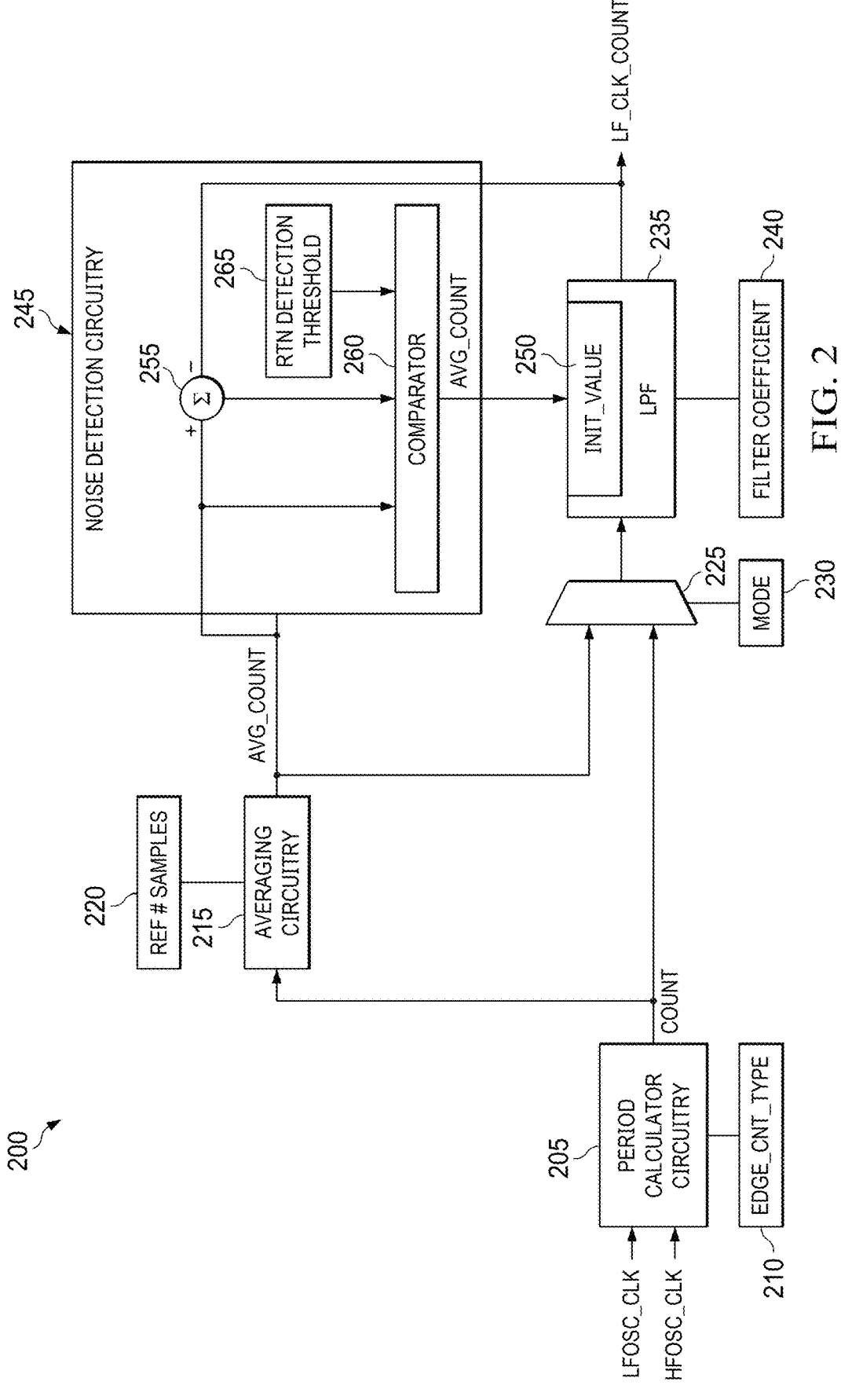
FIG. 2 is a block diagram of an example of the frequency tracking circuitry of FIG. 1 including example averaging circuitry and example coefficient filter circuitry.

FIG. 2 is a block diagram of example frequency tracking circuitry 200, which is an example of the frequency tracking circuitry 115 of FIG. 1. The frequency tracking circuitry 200 of FIG. 2 may be instantiated (e.g., creating an instance of, bring into being for any length of time, materialize, implement, etc.) by programmable circuitry executing first instructions, an Application Specific Integrated Circuit (ASIC), or a Field Programmable Gate Array (FPGA) structured or configured in response to execution of second instructions to perform operations corresponding to the first instructions. Some or all of the frequency tracking circuitry 200 of FIG. 2 may, thus, be instantiated at the same or different times. Some or all of the frequency tracking circuitry 200 of FIG. 2 may be instantiated, for example, in one or more threads executing concurrently on hardware or in series on hardware. Moreover, in some examples, some or all of the frequency tracking circuitry 200 of FIG. 2 may be implemented by microprocessor circuitry executing instructions or FPGA circuitry performing operations to implement one or more virtual machines or containers.

In the example of FIG. 2, the frequency tracking circuitry 200 includes period calculator circuitry 205, example edge count type circuitry 210, example averaging circuitry 215, example average size circuitry 220, example multiplexer circuitry 225, example mode circuitry 230, example coefficient filter circuitry 235, an example coefficient circuitry 240, and example noise detection circuitry 245. The example coefficient filter circuitry 235 of FIG. 2 includes example initial value circuitry 250. The example noise detection circuitry 245 of FIG. 2 includes example combination circuitry 255, example comparator circuitry 260, and example RTN detection threshold circuitry 265.

The frequency tracking circuitry 200 has a first input, a second input, and an output. The first input of the frequency tracking circuitry 200 is structured to be coupled to the oscillator circuitry 105 of FIG. 1, which supplies the high frequency oscillator signal (HFOSC_CLK). The second input of the frequency tracking circuitry 200 is structured to be coupled to the oscillator circuitry 110 of FIG. 1, which supplies the low frequency oscillator signal (LFOSC_CLK). The output of the frequency tracking circuitry 200 is structured to be coupled to the clock count circuitry 120 of FIG. 1, which stores the filtered count value (LF_CLK_COUNT).

The period calculator circuitry 205 has a first input, a second input, a third input, and an output. The first input of the period calculator circuitry 205 is coupled to the first input of the frequency tracking circuitry 200, which supplies the high frequency oscillator signal. The second input of the period calculator circuitry 205 is coupled to the second input of the frequency tracking circuitry 200, which supplies the low frequency oscillator signal. The third input of the period calculator circuitry 205 is coupled to the edge count type circuitry 210. The output of the period calculator circuitry 205 is coupled to the averaging circuitry 215 and the multiplexer circuitry 225. In some examples, the period calculator circuitry 205 is instantiated by application specific integrated circuitry or programmable circuitry executing period calculator instructions to perform operations such as those represented by the flowchart of FIGS. 5A and 5B.

The edge count type circuitry 210 is coupled to the period calculator circuitry 205. The edge count type circuitry 210 stores an edge count type configuration value (EDGE_CNT_TYPE), which controls the period calculator circuitry 205. In some examples, the edge count type circuitry 210 is communicatively coupled to the programmable circuitry 135 of FIG. 1, which sets the edge count type configuration value. Example operations of the period calculator circuitry 205 responsive to different edge count type configuration values are described in connection with FIGS. 5A and 5B, below. In some examples, the edge count type circuitry 210 is a register or portion of memory structured to store the edge count type configuration value. In some such examples, the edge count type circuitry 210 may be removed and illustrated or described in connection with the period calculator circuitry 205.

The averaging circuitry 215 has a first input, a second input, and an output. The first input of the averaging circuitry 215 is coupled to the period calculator circuitry 205 and the multiplexer circuitry 225. The second input of the averaging circuitry 215 is coupled to the average size circuitry 220. The output of the averaging circuitry 215 is coupled to the multiplexer circuitry 225 and the noise detection circuitry 245. In some examples, the averaging circuitry 215 is instantiated by application specific integrated circuitry or programmable circuitry executing averaging instructions to perform operations such as those represented by the flowchart of FIGS. 5A and 5B.

The average size circuitry 220 is coupled to the averaging circuitry 215. The average size circuitry 220 stores a reference number of samples value (REF #SAMPLES), which controls the averaging circuitry 215. In some examples, the average size circuitry 220 is communicatively coupled to the programmable circuitry 135, which sets the reference number of samples value. Example operations of the averaging circuitry 215 responsive to different reference number of samples values are described in connection with FIGS. 5A and 5B, below. In some examples, the average size circuitry 220 is a register or portion of memory structured to store the reference number of samples value. In some such examples, the average size circuitry 220 may be removed and illustrated or described in connection with the averaging circuitry 215.

The multiplexer circuitry 225 has a first input, a second input, a control input, and an output. The first input of the multiplexer circuitry 225 is coupled to the period calculator circuitry 205 and the averaging circuitry 215. The second input of the multiplexer circuitry 225 is coupled to the averaging circuitry 215 and the noise detection circuitry 245. The control input of the multiplexer circuitry 225 is coupled to the mode circuitry 230. The output of the multiplexer circuitry 225 is coupled to the coefficient filter circuitry 235. In some examples, the multiplexer circuitry 225 is instantiated by application specific integrated circuitry or programmable circuitry executing multiplexer instructions to perform operations such as those represented by the flowchart of FIGS. 5A and 5B.

The mode circuitry 230 is coupled to the multiplexer circuitry 225. The mode circuitry 230 stores a filter mode value (MODE), which controls the multiplexer circuitry 225. In some examples, the mode circuitry 230 is communicatively coupled to the programmable circuitry 135, which sets the filter mode value. Example operations of the multiplexer circuitry 225 responsive to different filter mode values are illustrated and described in connection with FIGS. 3, 4, 5, and 7, below. In some examples, the mode circuitry 230 is a register or portion of memory structured to store the filter mode value. In some such examples, the mode circuitry 230 may be removed and illustrated or described in connection with the multiplexer circuitry 225.

The coefficient filter circuitry 235 has a first input, a second input, a third input, and an output. The first input of the coefficient filter circuitry 235 is coupled to the multiplexer circuitry 225. The second input of the coefficient filter circuitry 235 is coupled to the coefficient circuitry 240. The third input of the coefficient filter circuitry 235 is coupled to the noise detection circuitry 245. The output of the coefficient filter circuitry 235 is coupled to the noise detection circuitry 245 and the output of the frequency tracking circuitry 200. In the example of FIG. 2, the coefficient filter circuitry 235 is structured as a low pass filter and may also be referred to as low-pass coefficient filter circuitry or low-pass filter circuitry. In some examples, the coefficient filter circuitry 235 is instantiated by application specific integrated circuitry or programmable circuitry executing coefficient filter instructions to perform operations such as those represented by the flowchart of FIGS. 5A and 5B.

The coefficient circuitry 240 is coupled to the coefficient filter circuitry 235. The coefficient circuitry 240 stores a filter coefficient value (FILTER COEFFICIENT), which controls the coefficient filter circuitry 235. In some examples, the coefficient circuitry 240 is communicatively coupled to the programmable circuitry 135, which sets the filter coefficient value. Example operations of the coefficient filter circuitry 235 responsive to different filter coefficient values are illustrated and described in connection with FIGS. 5 and 6, below. In some examples, the coefficient circuitry 240 is a register or portion of memory structured to store the filter coefficient value. In some such examples, the coefficient circuitry 240 may be removed and illustrated or described in connection with the coefficient filter circuitry 235.

The noise detection circuitry 245 has a first input, a second input, and an output. The first input of the noise detection circuitry 245 is coupled to the averaging circuitry 215 and the multiplexer circuitry 225. The second input of the noise detection circuitry 245 is coupled to the coefficient filter circuitry 235 and the output of the frequency tracking circuitry 200. In some examples, the noise detection circuitry 245 is instantiated by application specific integrated circuitry or programmable circuitry executing noise detection instructions to perform operations such as those represented by the flowchart of FIGS. 5A and 5B.

The initial value circuitry 250 is coupled to the noise detection circuitry 245. The initial value circuitry 250 stores an initial filter value (INIT_VALUE), which sets an initial value of the coefficient filter circuitry 235. Example operations of the coefficient filter circuitry 235 responsive to setting the initial filter value are illustrated and described in connection with FIGS. 5 and 7, below. In some examples, the initial value circuitry 250 is a register or portion of memory structured to set the initial filter value. In some such examples, the initial value circuitry 250 may be removed or described in connection with the coefficient filter circuitry 235.

The combination circuitry 255 has a first input, a second input, and an output. The first input of the combination circuitry 255 is coupled to the averaging circuitry 215, the multiplexer circuitry 225, and the comparator circuitry 260. The second input of the combination circuitry 255 is coupled to the coefficient filter circuitry 235 and the output of the frequency tracking circuitry 200. The output of the combination circuitry 255 is coupled to the comparator circuitry 260. In some examples, the combination circuitry 255 is instantiated by application specific integrated circuitry or programmable circuitry executing combination instructions to perform operations such as those represented by the flowchart of FIGS. 5A and 5B.

The comparator circuitry 260 has a first input, a second input, a third input, and an output. The first input of the comparator circuitry 260 is coupled to the averaging circuitry 215, the multiplexer circuitry 225, and the combination circuitry 255. The second input of the comparator circuitry 260 is coupled to the combination circuitry 255. The third input of the comparator circuitry 260 is coupled to the RTN detection threshold circuitry 265. The output of the comparator circuitry 260 is coupled to the initial value circuitry 250 or more generally the coefficient filter circuitry 235. In some examples, the comparator circuitry 260 is instantiated by application specific integrated circuitry or programmable circuitry executing comparator instructions to perform operations such as those represented by the flowchart of FIGS. 5A and 5B.

The RTN detection threshold circuitry 265 is coupled to the comparator circuitry 260. The RTN detection threshold circuitry 265 stores an RTN detection threshold value, which controls the comparison of the comparator circuitry 260. In some examples, the RTN detection threshold value is a threshold count representing a detection of RTN. Also, the RTN detection threshold circuitry 265 may be communicatively coupled to the programmable circuitry 135, which sets the RTN detection threshold value. Example operations of the comparator circuitry 260 responsive to the RTN detection threshold value are illustrated and described in connection with FIGS. 5A and 5B, below. In some examples, the RTN detection threshold circuitry 265 is a register or portion of memory structured to store the RTN detection threshold value. In some such examples, the RTN detection threshold circuitry 265 may be removed and illustrated or described in connection with the comparator circuitry 260.

Figure 3:
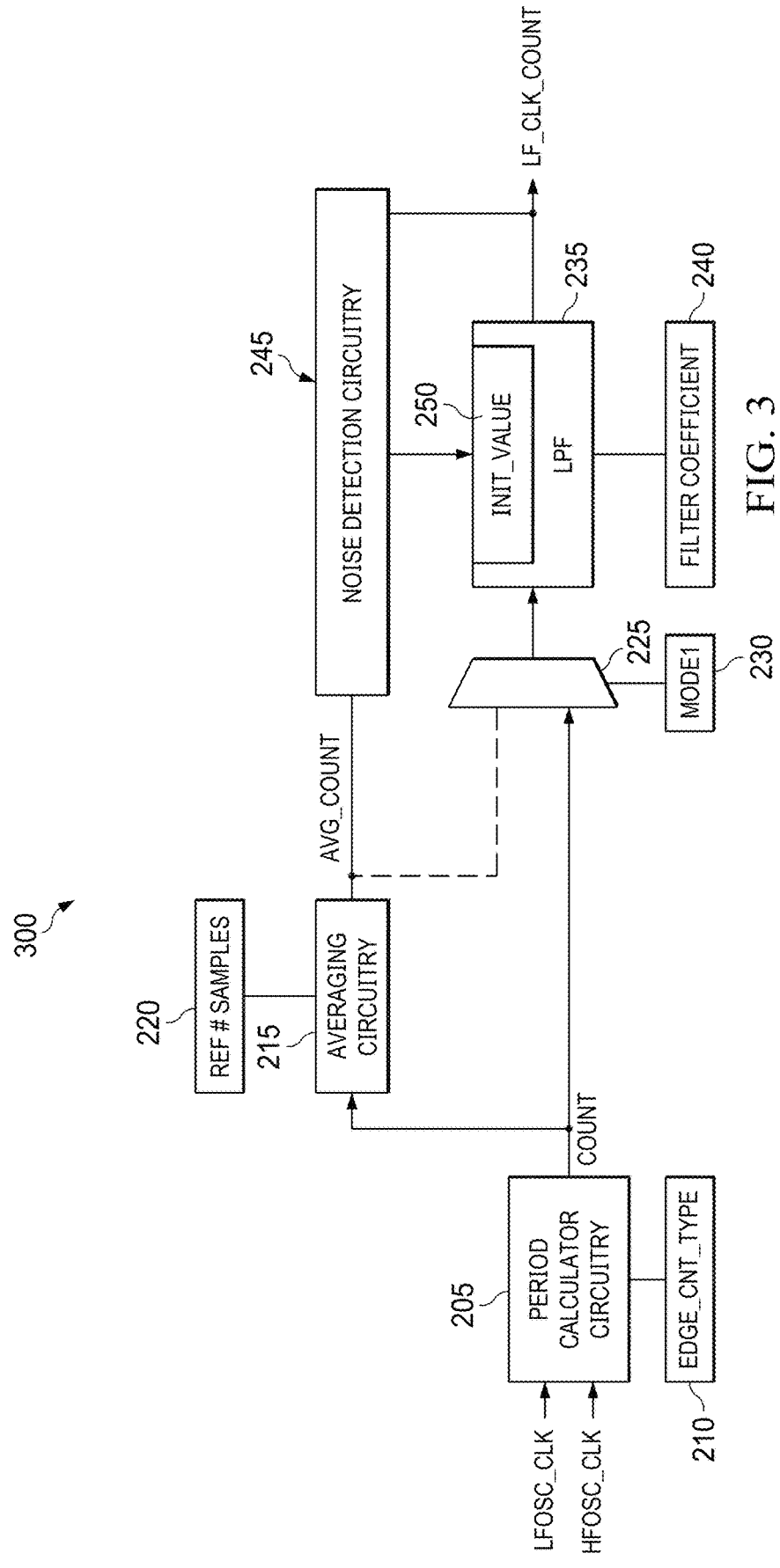
FIG. 3 is a block diagram of a first filter mode of operation of the frequency tracking circuitry of FIGS. 1 and 2 including the averaging circuitry of FIG. 2 and the coefficient filter circuitry of FIG. 2.

FIG. 3 is a block diagram of example frequency tracking circuitry 300, which is an example of the frequency tracking circuitry 115, 200 of FIGS. 1 and 2. In the example of FIG. 3, the frequency tracking circuitry 300 illustrates a first filter mode of the frequency tracking circuitry 200 of FIG. 2. The example frequency tracking circuitry 300 of FIG. 3 includes the period calculator circuitry 205, the edge count type circuitry 210, the averaging circuitry 215, the average size circuitry 220, the multiplexer circuitry 225, the mode circuitry 230, the coefficient filter circuitry 235, the coefficient circuitry 240, and the noise detection circuitry 245.

The frequency tracking circuitry 300 has a first input, a second input, and an output. The first input of the frequency tracking circuitry 300 is structured to be coupled to the oscillator circuitry 105, which supplies the high frequency oscillator signal (HFOSC_CLK). The second input of the frequency tracking circuitry 300 is structured to be coupled to the oscillator circuitry 110, which supplies the low frequency oscillator signal (LFOSC_CLK). The output of the frequency tracking circuitry 300 is structured to be coupled to the clock count circuitry 120, which stores the filtered count value (LF_CLK_COUNT).

In the example of FIG. 3, a first filter mode value (MODE1) of the mode circuitry 230 structures the multiplexer circuitry 225 to supply a count value (COUNT) from the period calculator circuitry 205 to the coefficient filter circuitry 235. In some examples, the programmable circuitry 135 sets the frequency tracking circuitry 300 to the first filter mode responsive to storing the first filter mode value in the mode circuitry 230. In other examples, the programmable circuitry 135 may directly control the multiplexer circuitry 225 to set the frequency tracking circuitry 300 to the first filter mode. The count value represents a count of a number of cycles of the high frequency oscillator signal at the first input of the frequency tracking circuitry 300 in a cycle of the low frequency oscillator signal at the second input of the frequency tracking circuitry 300. Example operations of the period calculator circuitry 205 are further illustrated and described in connection with FIGS. 5A and 5B, below.

In the first filter mode of FIG. 3, the coefficient filter circuitry 235 filters count values from the period calculator circuitry 205 using a filter coefficient value (FILTER COEFFICIENT) of the coefficient circuitry 240. In some examples, the filter coefficient value structures the coefficient filter circuitry 235 as low pass filter, which rejects relatively high frequency changes in the count value. The coefficient filter circuitry 235 produces a filtered count value (LF_CLK_COUNT) responsive to filtering samples of the count value. In such example operations, the programmable circuitry 135 controls the filter operations of the coefficient filter circuitry 235 responsive to setting the filter coefficient value in the coefficient circuitry 240. In other examples, the coefficient circuitry 240 is implemented by hardware, which may dynamically adjust the filter coefficient value based on a number of filtered samples. For example, the coefficient circuitry 240 may decrease the filter coefficient value as the coefficient filter circuitry 235 filters additional samples of the count value. Example operations of the coefficient filter circuitry 235 are further illustrated and described in connection with FIGS. 5A and 5B, below.

Also, in the first filter mode of FIG. 3, the averaging circuitry 215 filters the count values from the period calculator circuitry 205 to produce an average count (AVG_COUNT). The average count of the averaging circuitry 215 represents an empirical average of the count value across a reference number of samples, which is set by the average size circuitry 220. In some examples, the programmable circuitry 135 sets the average size circuitry 220. In other examples, the programmable circuitry 135 may directly control the averaging circuitry 215 to set the reference number of samples to average. In example operations, the noise detection circuitry 245 compares the average count to a previous value of the filtered count value. The noise detection circuitry 245 detects RTN noise responsive to a difference between the average count and the filtered count value being greater than a RTN threshold detection value of the RTN detection threshold circuitry 265. In such example operations, the noise detection circuitry 245 sets an initial value (INIT_VALUE) of the initial value circuitry 250 to the average count responsive to the detection of RTN. The initial value circuitry 250 resets the filter operations of the coefficient filter circuitry 235 responsive to an initial value from the noise detection circuitry 245. Example operations of the averaging circuitry 215 and the noise detection circuitry 245 are further illustrated and described in connection with FIGS. 5A and 5B, below.

Advantageously, the coefficient filter circuitry 235 rejects relatively high frequency changes in frequencies across samples of the count from the period calculator circuitry 205. Advantageously, the noise detection circuitry 245 resets filter operations of the coefficient filter circuitry 235 with the average count responsive to a detection of RTN. Advantageously, the averaging circuitry 215 and the noise detection circuitry 245 improve the accuracy of the filtered count value by decreasing a response time to RTN change in frequency.

Figure 4:
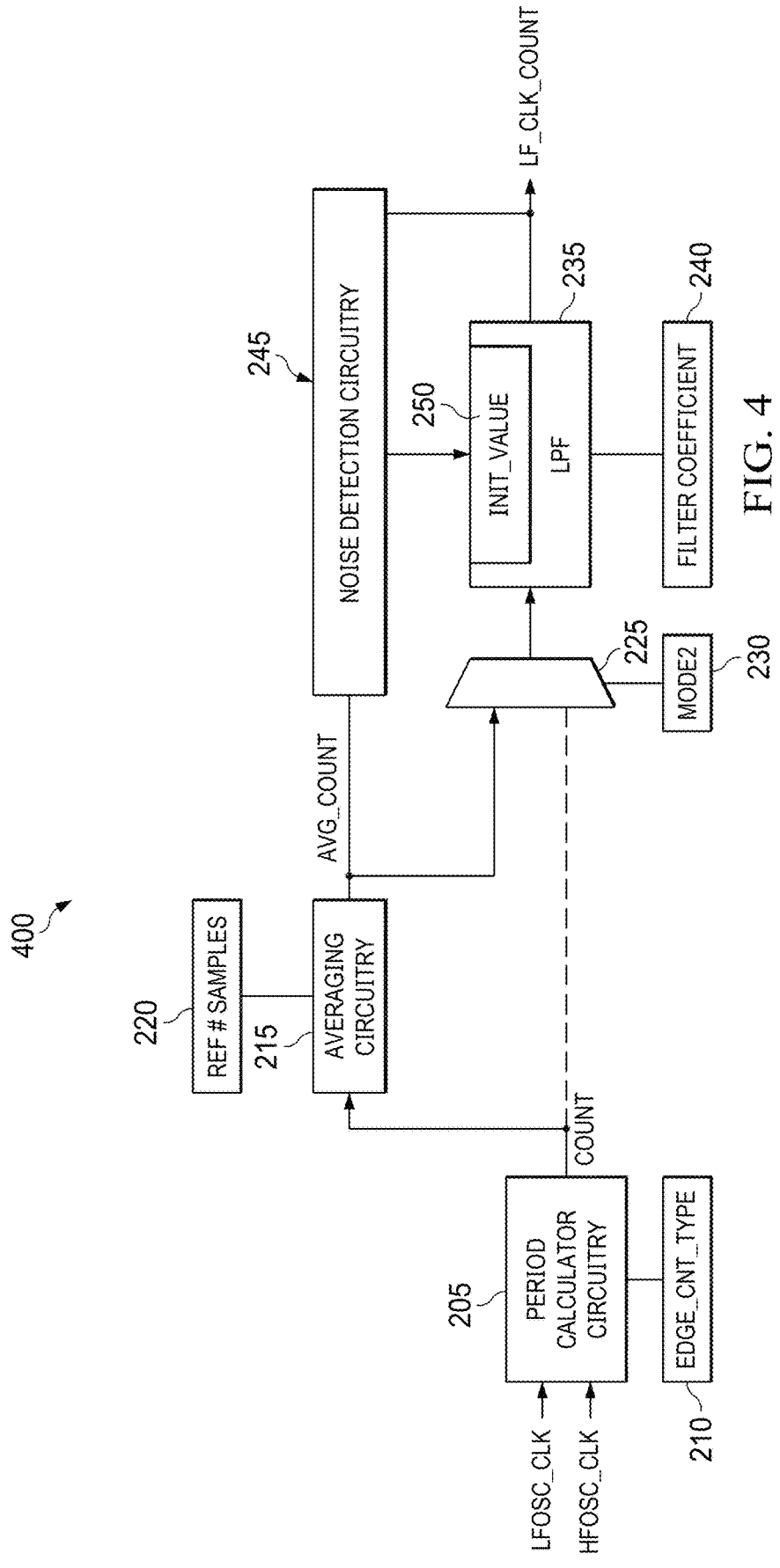
FIG. 4 is a block diagram of a second filter mode of operation of the frequency tracking circuitry of FIGS. 1, 2, and 3 including the averaging circuitry of FIGS. 2 and 3 and the coefficient filter circuitry of FIGS. 2 and 3.

FIG. 3 represents a first mode for the tracking circuitry, and FIG. 4 represents a second mode for the tracking circuitry. In the first mode, the tracking circuitry may operate in an "instantaneous" mode that is better tuned for tracking variations in the count value. In the second mode, the tracking circuitry may operate in an averaging mode that is better tuned for rejecting noise.

FIG. 4 is a block diagram of example frequency tracking circuitry 400, which is an example of the frequency tracking circuitry 115, 200, 300 of FIGS. 1, 2, and 3. In the example of FIG. 4, the frequency tracking circuitry 300 illustrates a second filter mode of the frequency tracking circuitry 200 of FIG. 2. The example frequency tracking circuitry 400 of FIG. 4 includes the period calculator circuitry 205, the edge count type circuitry 210, the averaging circuitry 215, the average size circuitry 220, the multiplexer circuitry 225, the mode circuitry 230, the coefficient filter circuitry 235, the coefficient circuitry 240, and the noise detection circuitry 245. In the example shown in FIG. 4, the averaging circuitry 215 and the coefficient filter circuitry 235 are arranged as cascading low-pass filters.

The frequency tracking circuitry 400 has a first input, a second input, and an output. The first input of the frequency tracking circuitry 400 is structured to be coupled to the oscillator circuitry 105, which supplies the high frequency oscillator signal (HFOSC_CLK). The second input of the frequency tracking circuitry 400 is structured to be coupled to the oscillator circuitry 110, which supplies the low frequency oscillator signal (LFOSC_CLK). The output of the frequency tracking circuitry 400 is structured to be coupled to the clock count circuitry 120, which stores the filtered count value (LF_CLK_COUNT).

In the example of FIG. 4, a second filter mode value (MODE2) of the mode circuitry 230 structures the multiplexer circuitry 225 to supply the average count value from the averaging circuitry 215 to the coefficient filter circuitry 235. In some examples, the programmable circuitry 135 sets the frequency tracking circuitry 300 to the second filter mode responsive to storing the second filter mode value in the mode circuitry 230. In other examples, the programmable circuitry 135 may directly control the multiplexer circuitry 225 to set the frequency tracking circuitry 300 to the second filter mode. The averaging circuitry 215 filters count values from the period calculator circuitry 205 to produce the average count. The average count of the averaging circuitry 215 represents an empirical average of the count value across a reference number of samples, which is set by the average size circuitry 220. In some examples, the programmable circuitry 135 sets the average size circuitry 220. In other examples, the programmable circuitry 135 may directly control the averaging circuitry 215 to set the reference number of samples to average. Example operations of the period calculator circuitry 205 and the averaging circuitry 215 are further illustrated and described in connection with FIGS. 5A and 5B, below.

In the second filter mode of FIG. 4, the coefficient filter circuitry 235 filters the average count values from the averaging circuitry 215 using the filter coefficient value of the coefficient circuitry 240. In some examples, the filter coefficient value structures the coefficient filter circuitry 235 as low pass filter, which rejects relatively high frequency changes in the average count value. The coefficient filter circuitry 235 produces the filtered count value responsive to filtering samples of the average count value. In such example operations, the programmable circuitry 135 controls the filter operations of the coefficient filter circuitry 235 responsive to setting the filter coefficient value in the coefficient circuitry 240. In other examples, the coefficient circuitry 240 is implemented by hardware, which may dynamically adjust the filter coefficient value based on a number of filtered samples. For example, the coefficient circuitry 240 may decrease the filter coefficient value as the coefficient filter circuitry 235 filters additional samples of the average count value. Example operations of the coefficient filter circuitry 235 are further illustrated and described in connection with FIGS. 5A and 5B, below.

Also, in the second filter mode of FIG. 4, the noise detection circuitry 245 compares the average count to a previous value of the filtered count value. The noise detection circuitry 245 detects RTN noise responsive to a difference between the average count and the filtered count value being greater than a RTN threshold detection value of the RTN detection threshold circuitry 265. In such example operations, the noise detection circuitry 245 sets the initial value of the initial value circuitry 250 to the average count responsive to the detection of RTN. The initial value circuitry 250 resets the filter operations of the coefficient filter circuitry 235 responsive to an initial value from the noise detection circuitry 245. Example operations of the noise detection circuitry 245 are further illustrated and described in connection with FIGS. 5A and 5B, below.

Advantageously, filtering the average count of the averaging circuitry 215 using the coefficient filter circuitry 235 improves a rejection of relatively high frequency changes in oscillator frequency. Advantageously, the compounding filter operations of the averaging circuitry 215 and the coefficient filter circuitry 235 improve the accuracy of the filtered count value. Advantageously, the noise detection circuitry 245 resets the filter operations of the coefficient filter circuitry 235 with the average count responsive to a detection of RTN. Advantageously, the averaging circuitry 215 and the noise detection circuitry 245 improve the accuracy of the filtered count value by increasing a response time to RTN change in frequency.

Figure 5B:
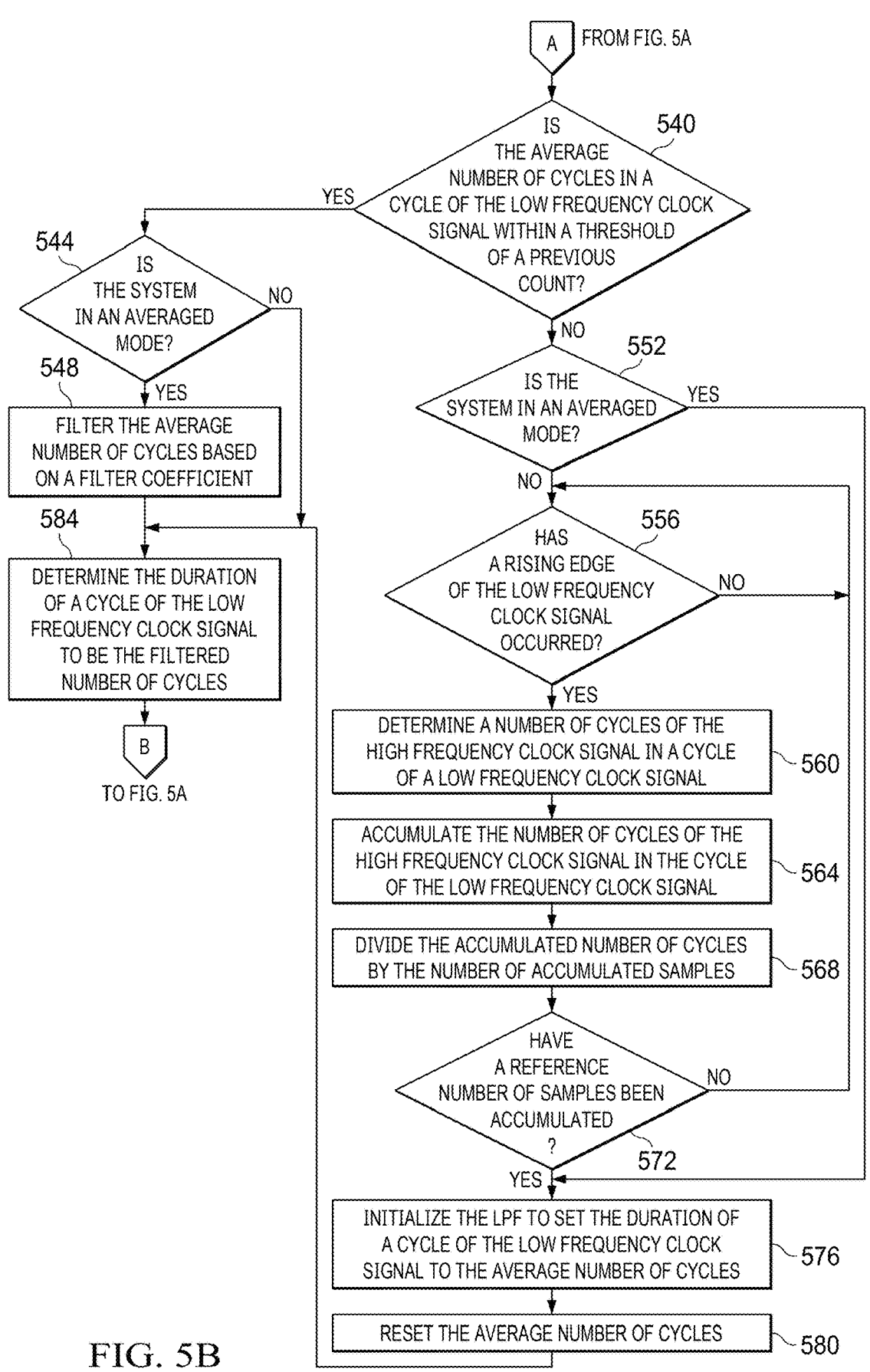

FIGS. 5A and 5B form a flowchart representative of example machine-readable instructions or example operations 500 that may be at least one of executed, instantiated, or performed using an example implementation of the frequency tracking circuitry 115, 200, 300, 400 of FIGS. 1, 2, 3, and 4, or more generally the SoC 100 of FIG. 1. The example operations 500 of FIGS. 5A and 5B begin at Block 504 at which the clock controller circuitry 125 of FIG. 1 determines if the system is in a standby mode. In some examples, the programmable circuitry 135 of FIG. 1 sets the SoC 100 to a standby mode responsive to a lack of data from the interface circuitry 140 of FIG. 1 for a time greater than a standby threshold. In such examples, the programmable circuitry 135 structures the SoC 100 for standby mode responsive to setting a standby indication (STANDBY). In example operations, the clock controller circuitry 125 determines the state of the SoC 100 responsive to the state of the standby indication from the programmable circuitry 135. For example, the clock controller circuitry 125 detects the SoC 100 is in standby mode responsive to the standby indication being a first value (e.g., logic one, digital high, etc.). In such an example, the clock controller circuitry 125 detects the SoC 100 is not in standby mode responsive to the standby indication being a second value (e.g., logic zero, digital low, etc.). Advantageously, entering standby mode during periods of time where the SoC 100 is inactive reduces power consumption.

If the clock controller circuitry 125 determines that the system is not in a standby mode (e.g., Block 505 returns a result of NO), the period calculator circuitry 205 of FIG. 2 determines if a rising edge of the low frequency clock signal has occurred. (Block 508). In normal mode, the oscillator circuitry 105 is powered on to accurately track the passage of time using the RTC accumulator circuitry 130. If the period calculator circuitry 205 determines that a rising edge of the low frequency clock signal has not occurred (e.g., Block 508 returns a result of NO), control proceeds to return to Block 504.

If the period calculator circuitry 205 determines that a rising edge of the low frequency clock signal has occurred (e.g., Block 508 returns a result of YES), the period calculator circuitry 205 determines a number of cycles of the high frequency clock signal in a cycle of a low frequency clock signal. (Block 512). In example operations, the period calculator circuitry 205 produces a count (COUNT) of a number of cycles of the high frequency clock signal from the oscillator circuitry 105 in a portion of the low frequency clock signal (LFOSC) from the oscillator circuitry 110 of FIG. 1. The count provides a ratio between the frequencies of the oscillator signals from the oscillator circuitry 105, 110. In such example operations, the ratio between the oscillator signals of the oscillator circuitry 105, 110 changes responsive to random telegraph noise, changes in PVT conditions, etc.

In some examples, the edge count type circuitry 210 of FIG. 2 structures the period calculator circuitry 205 to produce the count as the number cycles of the high frequency clock signal between rising edges of the low frequency clock signal. In other examples, the edge count type circuitry 210 structures the period calculator circuitry 205 to produce a first count for the number cycles of the high frequency clock signal between rising edges of the low frequency clock signal and a second count for between falling edges of the low frequency clock signal. Advantageously, structuring the period calculator circuitry 205 to produce counts for a cycle of rising edges and a cycle of falling edges decreases the duration to produce an average count.

The clock controller circuitry 125 increments an RTC count with a high frequency clock signal. (Block 516). During normal operations of the SoC 100 (e.g., not in standby mode), the oscillator circuitry 105 actively produces the high frequency oscillator signal (HFOSC). In such example operations, the clock controller circuitry 125 increments the RTC count of the RTC accumulator circuitry 130 of FIG. 1 responsive to the high frequency oscillator signal. Advantageously, the high frequency oscillator signal is a relatively high accuracy oscillator signal, which increases the accuracy of the RTC count of the RTC accumulator circuitry 130 during normal operations.

The multiplexer circuitry 225 of FIG. 2 determines if the system is in an averaged mode. (Block 520). In some examples, the mode circuitry 230 of FIGS. 2, 3, and 4 structures the multiplexer circuitry 225 to one of the first filter mode or the second filter mode. In the first filter mode, as illustrated by the frequency tracking circuitry 300 of FIG. 3, the multiplexer circuitry 225 supplies the count from the period calculator circuitry 205 to the coefficient filter circuitry 235. In the second filter mode, as illustrated by the frequency tracking circuitry 400 of FIG. 4, the multiplexer circuitry 225 supplies the average count from the averaging circuitry 215 to the coefficient filter circuitry 235.

If the multiplexer circuitry 225 determines that the system is not in an averaged mode (e.g., Block 520 returns a result of NO), the coefficient filter circuitry 235 filters the number of cycles based on a filter coefficient. (Block 524). In example operations, as illustrated in FIG. 3, the multiplexer circuitry 225 couples the period calculator circuitry 205 to the coefficient filter circuitry 235 responsive to the mode value of the mode circuitry 230. In such examples, the coefficient filter circuitry 235 uses a filter coefficient of the coefficient circuitry 240 to filter the count from the period calculator circuitry 205.

If the multiplexer circuitry 225 determines that the system is in an averaged mode (e.g., Block 520 returns a result of YES) or control proceeds from Block 524, the averaging circuitry 215 of FIG. 2 accumulates the number of cycles of the high frequency clock signal in the cycle of the low frequency clock signal. (Block 528). In some examples, the averaging circuitry 215 generates an average count (AVG_COUNT) by filtering the count from the period calculator circuitry 205. In example operations, the averaging circuitry 215 accumulates a reference number of samples of the count from the period calculator circuitry 205 to determine the average count across the reference number of samples.

The averaging circuitry 215 divides the accumulated number of cycles by the number of accumulated samples. (Block 532). In example operations, the averaging circuitry 215 determines the average count responsive to dividing the accumulated counts of the period calculator circuitry 205 by the number of accumulated samples. In such examples, the averaging circuitry 215 filters the determined counts of the period calculator circuitry 205 across a plurality of evenly weighed previous counts. Such a determination of the average count may be referred to as an empirical or pure average.

The averaging circuitry 215 determines if a reference number of samples have been accumulated. (Block 536). In some examples, the average size circuitry 220 of FIG. 2 sets the reference number of samples of the averaging circuitry 215. In such examples, the reference number of samples of the averaging circuitry 215 may be determined in reference to a minimum time ($t_{meas}$) to operate the averaging circuitry 215. The minimum time may be determined based on a desired accuracy (Er) in parts per million, a function of jitter ($J_{LFOSC}$), a frequency of the oscillator circuitry 110 ($f_{LFOSC}$), and a confidence interval of a distribution of error ($Z_{\alpha/2}$). In some examples, such as wireless systems, uniform standards (e.g., Bluetooth low energy (BLE) standards) provide the desired accuracy needed to meet uniform specifications. The minimum averaging time may be determined using Equation (1), below. Advantageously, averaging counts across a duration greater than or equal to the minimum time of Equation (1) increases the likelihood of achieving the desired accuracy. If the averaging circuitry 215 determines that a reference number of samples have not been accumulated (e.g., Block 536 returns a result of NO), control proceeds to return to Block 508.

$$t_{meas} \geq \frac{|z_{\alpha/2}|^2 * J_{LFOSC}^2}{\epsilon_r{}^2 (\text{in ppm})} * f_{LFOSC} \qquad \text{Equation (1)}$$

If the averaging circuitry 215 determines that a reference number of samples have been accumulated (e.g., Block 536 returns a result of YES), the noise detection circuitry 245 of FIG. 2 determines if the average number of cycles in a cycle of the low frequency clock signal is within a threshold of a previous filtered count. (Block 540). In example operations, the combination circuitry 255 of FIG. 2 determines a count difference (also referred to as an error value) as the difference between the average count from the averaging circuitry 215 and the filtered count value at the output of the frequency tracking circuitry 200, 300, 400. In such example operations, the comparator circuitry 260 of FIG. 2 compares the determined difference to the noise threshold value from the RTN detection threshold circuitry 265 of FIG. 2. The noise threshold value represents an acceptable change in the average count during the time taken to collect the reference number of samples.

If the noise detection circuitry 245 determines that the average number of cycles is within the threshold of the previous filtered count (e.g., Block 540 returns a result of YES), the multiplexer circuitry 225 determines if the system is in an averaged mode. (Block 544). In some examples, the mode circuitry 230 structures the multiplexer circuitry 225 to one of the first filter mode or the second filter mode. In the first filter mode, as illustrated by the frequency tracking circuitry 300, the multiplexer circuitry 225 supplies the count from the period calculator circuitry 205 to the coefficient filter circuitry 235. In the second filter mode, as illustrated by the frequency tracking circuitry 400, the multiplexer circuitry 225 supplies the average count from the averaging circuitry 215 to the coefficient filter circuitry 235.

If the multiplexer circuitry 225 determines that the system is in an averaged mode (e.g., Block 544 returns a result of YES), the coefficient filter circuitry 235 of FIG. 2 filters the average number of cycles based on a filter coefficient. (Block 548). In example operations, as illustrated in FIG. 4, the multiplexer circuitry 225 couples the averaging circuitry 215 to the coefficient filter circuitry 235 responsive to the mode value of the mode circuitry 230. In such examples, the coefficient filter circuitry 235 uses a filter coefficient of the coefficient circuitry 240 filter the average count from the averaging circuitry 215. Advantageously, in the second filter mode, both the averaging circuitry 215 and the coefficient filter circuitry 235 filter the count from the period calculator circuitry 205. Advantageously, the additional filtering of the averaging circuitry 215 improves the accuracy of the frequency tracking circuitry 115, 200, 300, 400 responsive to reducing the impact of relatively high frequency changes in frequency.

If the noise detection circuitry 245 determines that the average number of cycles in a cycle of the low frequency clock signal is not within the threshold of the previous average (e.g., Block 540 returns a result of NO), the multiplexer circuitry 225 determines if the system is in an averaged mode. (Block 552). In some examples, the mode circuitry 230 structures the multiplexer circuitry 225 to one of the first filter mode or the second filter mode. In the first filter mode, as illustrated by the frequency tracking circuitry 300, the multiplexer circuitry 225 supplies the count from the period calculator circuitry 205 to the coefficient filter circuitry 235. In the second filter mode, as illustrated by the frequency tracking circuitry 400, the noise detection circuitry 245 re-initializes the coefficient filter circuitry 235 using the average count from the averaging circuitry 215. For example, the noise detection circuitry 245 clears previous values of the coefficient filter circuitry 235 and provides a first value of the average count from the averaging circuitry 215.

If the multiplexer circuitry 225 determines that the system is not in an averaged mode (e.g., Block 552 returns a result of NO), the clock controller circuitry 125 determines if a rising edge of the low frequency clock signal has occurred. (Block 556). In normal mode, the oscillator circuitry 105 is powered on to accurately track the passage of time using the RTC accumulator circuitry 130. If the period calculator circuitry 205 determines that a rising edge of the low frequency clock signal has not occurred (e.g., Block 556 returns a result of NO), control proceeds to return to Block 556.

The period calculator circuitry 205 determines a number of cycles of the high frequency clock signal in a cycle of a low frequency clock signal. (Block 560). In example operations, the period calculator circuitry 205 produces the count (COUNT) of a number of cycles of the high frequency clock signal from the oscillator circuitry 105 in a portion of the low frequency clock signal (LFOSC) from the oscillator circuitry 110. The count provides a ratio between the frequencies of the oscillator signals from the oscillator circuitry 105, 110. In such example operations, the ratio between oscillator signals of the oscillator circuitry 105, 110 changes responsive to random telegraph noise, changes in PVT conditions, etc.

The averaging circuitry 215 accumulates the number of cycles of the high frequency clock signal in the cycle of the low frequency clock signal. (Block 564). In some examples, the averaging circuitry 215 generates an average count (AVG_COUNT) by filtering the count from the period calculator circuitry 205. In example operations, the averaging circuitry 215 accumulates a reference number of samples of the count from the period calculator circuitry 205 to determine the average count across the reference number of samples.

The averaging circuitry 215 divides the accumulated number of cycles by the number of accumulated samples. (Block 568). In example operations, the averaging circuitry 215 determines the average count responsive to dividing the accumulated counts of the period calculator circuitry 205 by the number of accumulated samples. In such examples, the averaging circuitry 215 filters the determined counts of the period calculator circuitry 205 across a plurality of evenly weighed previous counts. Such a determination of the average count may be referred to as an empirical or pure average.

The averaging circuitry 215 determines if a reference number of samples have been accumulated. (Block 572). Similar to the operations of Block 536, the averaging circuitry 215 may use Equation (1), above, to determine a minimum number of samples to achieve a target error. However, unlike the operations of Block 536, the operations of Blocks 552, 556, 560, 564, 568, 572 occur responsive to a detection of RTN (e.g., Block 540 returned a result of NO). In such example operations, the reference number of samples accumulated may be different between Blocks 536, 572. For example, decreasing the reference number of samples accumulated in Block 572 increases the response time of the frequency tracking circuitry 115, 200, 300, 400 to changes in frequency responsive to RTN. Advantageously, changing the number of reference samples between Blocks 536, 572 may improve the response time to RTN. If the averaging circuitry 215 determines that the reference number of samples have not been accumulated (e.g., Block 572 returns a result of NO), control proceeds to return to Block 556.

If the averaging circuitry 215 determines that the reference number of samples have been accumulated (e.g., Block 572 returns a result of YES), the noise detection circuitry 245 initializes filter circuitry to set the duration of a cycle of the low frequency clock signal to the average number of cycles. (Block 576). In some examples, the comparator circuitry 260 detects RTN responsive to the difference from the combination circuitry 255 being greater than the noise threshold value from the RTN detection threshold circuitry 265. In such example operations, the comparator circuitry 260 sets an initial value of the initial value circuitry 250 of FIGS. 2, 3, and 4 to the average count from the averaging circuitry 215. Advantageously, reinitializing the coefficient filter circuitry 235 using the average count improves the response time of the coefficient filter circuitry 235 to changes in the frequency of the oscillator circuitry 110 responsive to RTN.

The averaging circuitry 215 resets the average number of cycles. (Block 580). In some examples, the frequency of the oscillator circuitry 110 shifts responsive to electrons being stuck inside a transistors gate. Such a shift in the oscillator circuitry 110 is referred to as RTN. However, as the oscillator circuitry 110 continues to operate, the electrons are released and the frequency of the oscillator circuitry 110 shifts again. In example operations, the averaging circuitry 215 clears the accumulated count responsive to a detection of RTN to reduce the impact of the detected RTN on further samples.

If the multiplexer circuitry 225 determines that the system is not in an averaged mode (e.g., Block 544 returns a result of NO) or control proceeds from either Blocks 548, 580, the coefficient filter circuitry 235 determines the duration of a cycle of the low frequency clock signal to be the filtered number of cycles. (Block 584). In example operations, the coefficient filter circuitry 235 sets the filtered count value (LF_CLK_COUNT) responsive to filtering one of the average count or count by the filter coefficient of the coefficient circuitry 240. In some examples, the coefficient filter circuitry 235 sets the value of the clock count circuitry 120 of FIG. 1. Control proceeds to return to Block 504.

If the clock controller circuitry 125 determines that the system is in a standby mode (e.g., Block 504 returns a result of YES), the clock controller circuitry 125 determines if a rising edge of the low frequency clock signal has occurred. (Block 588). In standby mode, the oscillator circuitry 105 is powered off to reduce power consumption. In example operations without the oscillator circuitry 105, the clock controller circuitry 125 uses the low frequency oscillator signal from the oscillator circuitry 110 and the filtered count value in the clock count circuitry 120 to continue to increment the RTC count of the RTC accumulator circuitry 130. If the clock controller circuitry 125 determines that a rising edge of the low frequency clock signal has not occurred (e.g., Block 588 returns a result of NO), control proceeds to return to Block 504.

If the clock controller circuitry 125 determines that a rising edge of the low frequency clock signal has occurred (e.g., Block 588 returns a result of YES), the clock controller circuitry 125 increments the RTC count by the determined duration of a cycle of the low frequency clock signal. (Block 592). In example operations, the count value of the clock count circuitry 120 represents the number of cycles of the high frequency clock signal from the oscillator circuitry 105 in a cycle of the low frequency clock signal from the oscillator circuitry 110. In such example operations, the clock controller circuitry 125 increments the RTC count of the RTC accumulator circuitry 130 by the filtered count value to approximate the operations during normal operations. Control proceeds to return to Block 504.

Example methods are described with reference to the flowchart illustrated in FIGS. 5A and 5B. However, many other methods of implementing the frequency tracking circuitry 115, 200, 300, 400 of FIGS. 1, 2, 3, and 4, or more generally the SoC 100 of FIG. 1 may also be used in this description. For example, the order of execution of the blocks may be changed, or some of the blocks described may be changed, eliminated, or combined. Similarly, additional operations may be included in the manufacturing process before, in between, or after the blocks shown in the illustrated examples.

Figure 6:
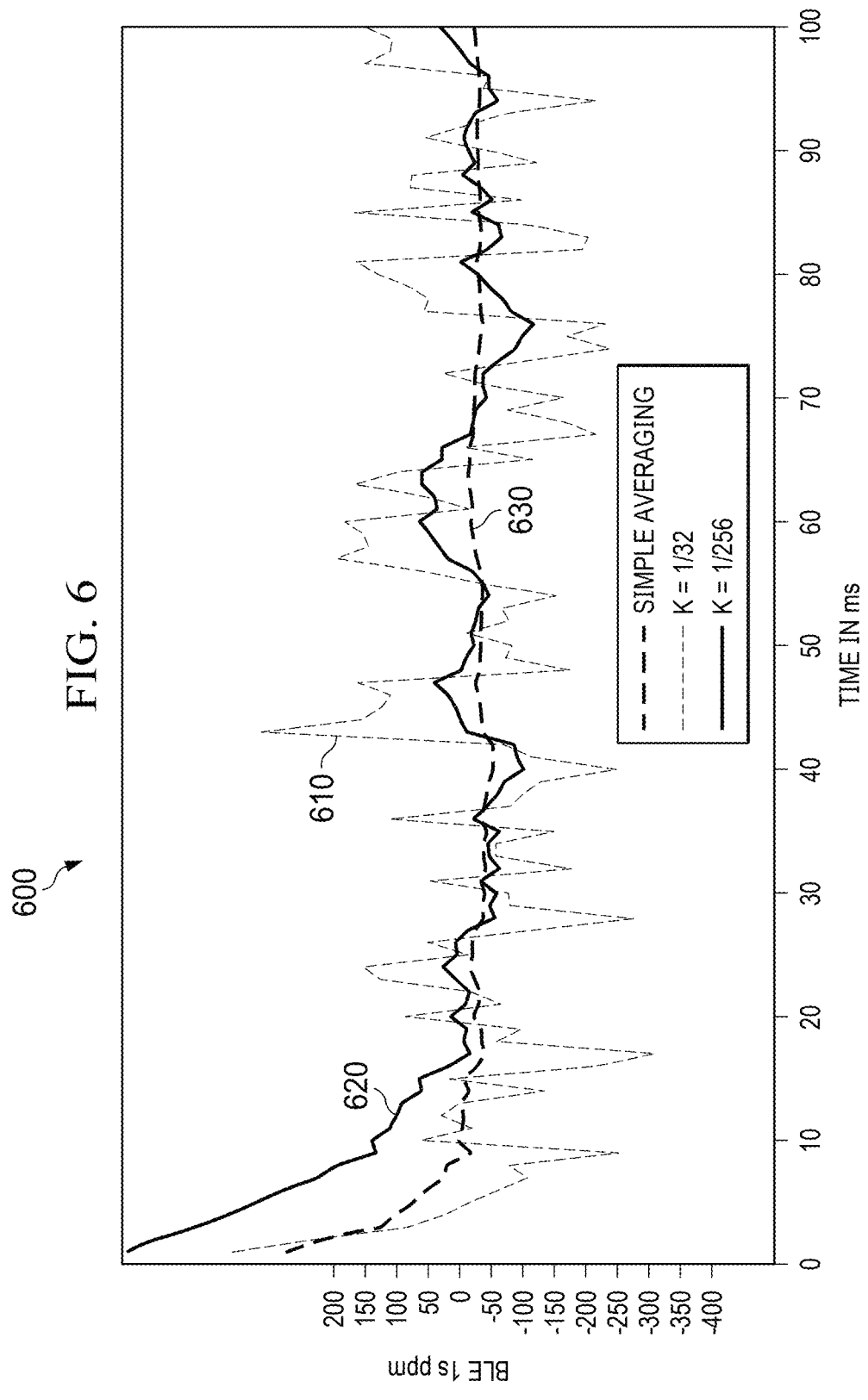
FIG. 6 is a timing diagram of example operations of the averaging circuitry of FIGS. 2, 3, and 4 and the coefficient filter circuitry of FIGS. 2, 3, and 4.

FIG. 6 is a timing diagram 600 of example operations of the averaging circuitry 215 of FIGS. 2, 3, and 4 and the coefficient filter circuitry 235 of FIGS. 2, 3, and 4. In the example of FIG. 6, the timing diagram 600 illustrates a first coefficient filter output 610, a second coefficient filter output 620, and an averaging filter output 630. The first coefficient filter output 610 illustrates filtering operations of the coefficient filter circuitry 235 responsive to the coefficient circuitry 240 of FIGS. 2, 3, and 4 having a filter coefficient value set to one divided by thirty-two. The second coefficient filter output 620 illustrates filtering operations of the coefficient filter circuitry 235 responsive to the coefficient circuitry 240 having a filter coefficient value set to one divided by two-hundred and fifty-six. The averaging filter output 630 illustrates the average count of the averaging circuitry 215.

In the example operations of FIG. 6, the second coefficient filter output 620 rejects relatively high frequency changes in frequency better than the first coefficient filter output 610. However, the first coefficient filter output 610 responds to extended shift in frequency, which represent RTN, while the second coefficient filter output 620 completely rejects changes resulting from RTN. Such differences between the filter outputs 610, 620 is responsive to the difference in the filter coefficient. Meanwhile, the averaging filter output 630 filters relatively high frequency changes in frequency even better than both of the filter outputs 610, 620. Advantageously, the noise detection circuitry 245 responds to RTN frequency changes, which the averaging filter output 630 cannot. Advantageously, the operations of Block 565 to reset the averaging circuitry 215 responsive to a detection of RTN allows the averaging circuitry 215 to respond to RTN.

Figure 7:
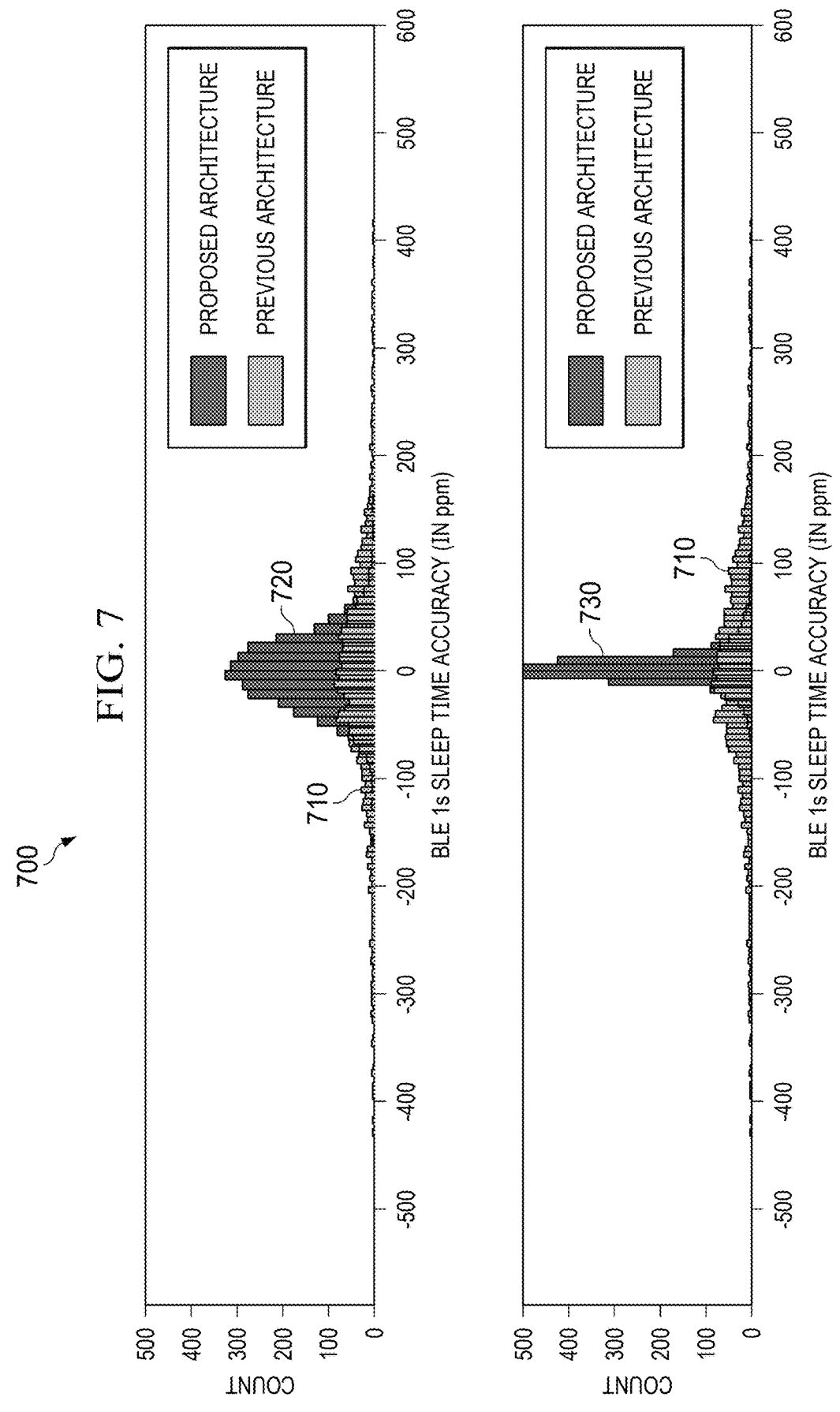
FIG. 7 is a plot of example operations of the frequency tracking circuitry of FIGS. 1, 2, 3, and 4.

FIG. 7 is a plot 700 of example operations of the frequency tracking circuitry 115, 200, 300, 400 of FIGS. 1, 2, 3, and 4. In the example of FIG. 7, the plot 700 illustrates a reference standby accuracy 710, a first filter mode standby accuracy 720, and a second filter mode standby accuracy 730. The reference standby accuracy 710 represents an accuracy of the output of the frequency tracking circuitry 115, 200 when the coefficient filter circuitry 235 of FIGS. 2, 3, and 4 filters the count from the period calculator circuitry 205 of FIGS. 2, 3, and 4 without the noise detection circuitry 245 of FIGS. 2, 3, and 4. The first filter mode standby accuracy 720 represents an accuracy of the output of the frequency tracking circuitry 115, 200 when the coefficient filter circuitry 235 filters the count from the period calculator circuitry 205 with the noise detection circuitry 245. The second filter mode standby accuracy 730 represents an accuracy of the output of the frequency tracking circuitry 115, 200 when the coefficient filter circuitry 235 filters the average count from the averaging circuitry 215 with the noise detection circuitry 245.

Advantageously, in the first filter mode, the averaging circuitry 215 and the noise detection circuitry 245 improve the first filter mode standby accuracy 720, by accounting for RTN shifts in frequency. Advantageously, in the second filter mode, the compounding filter operations of the averaging circuitry 215 and the coefficient filter circuitry 235 improve the second filter mode standby accuracy 730. Also, the noise detection circuitry 245 further improves the second filter mode standby accuracy 730 responsive to accounting for RTN shifts in frequency.

Figure 8:
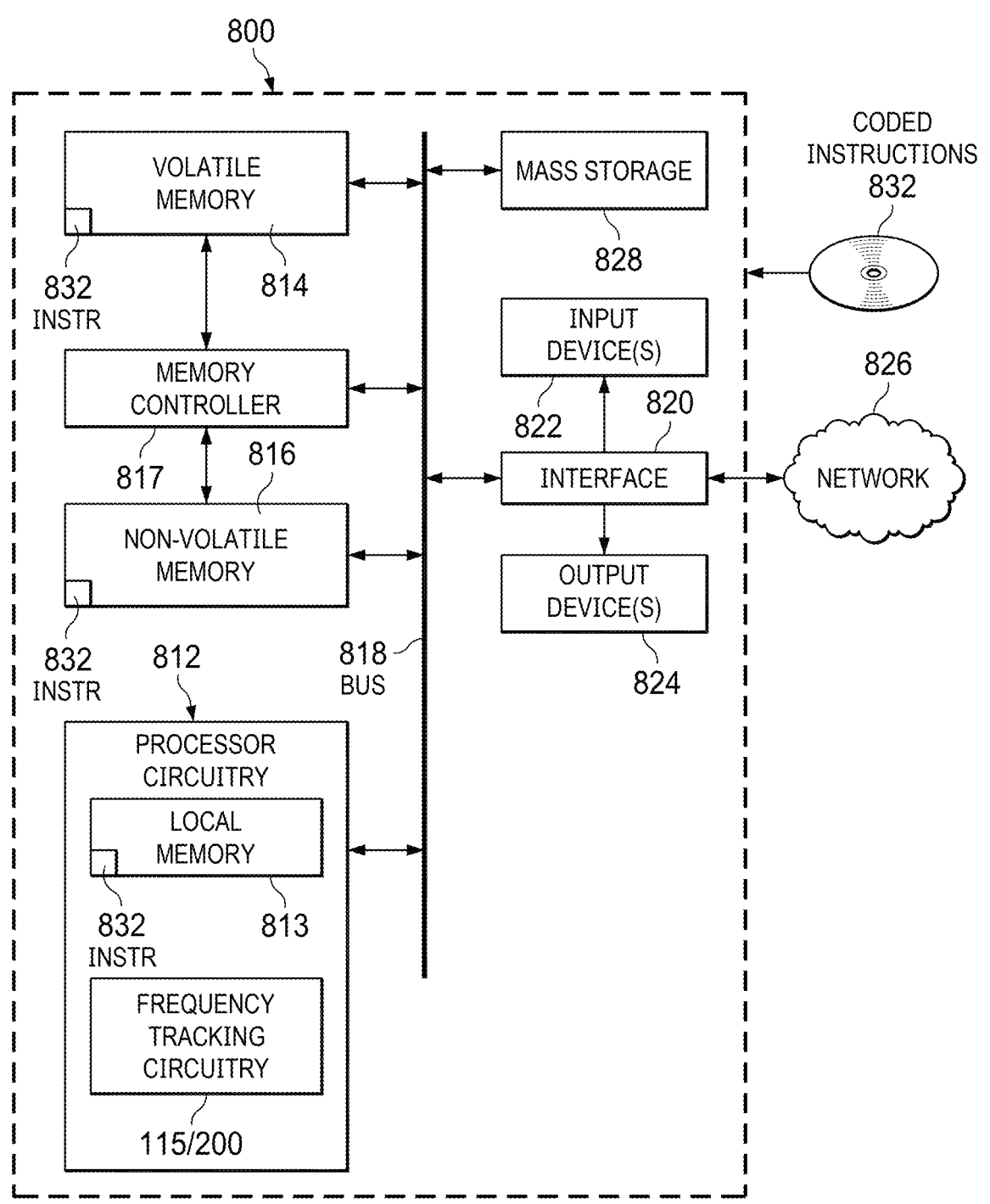
FIG. 8 is a block diagram of an example processing platform including programmable circuitry structured to execute, instantiate, or perform the example machine-readable instructions or perform the example operations of FIGS. 5A and 5B to implement the frequency tracking circuitry 115, 200, 300, 400 of FIGS. 1, 2, 3, and 4.

FIG. 8 is a block diagram of an example programmable circuitry platform 800 structured to one or a combination of execute or instantiate one or more of the example machine-readable instructions or the example operations of FIGS. 5A and 5B to implement the frequency tracking circuitry 115, 200, 300, 400 of FIGS. 1, 2, 3, and 4. The programmable circuitry platform 800 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing or electronic device.

The programmable circuitry platform 800 of the illustrated example includes programmable circuitry 812. The programmable circuitry 812 of the illustrated example is hardware. For example, the programmable circuitry 812 can be implemented by one or more integrated circuits, logic circuits, FPGAs, microprocessors, CPUs, GPUs, DSPs, or microcontrollers from any desired family or manufacturer. The programmable circuitry 812 may be implemented by one or more semiconductor based (e.g., silicon based) devices. In this example, the programmable circuitry 812 implements one or more of the period calculator circuitry 205 of FIGS. 2, 3, and 4, the averaging circuitry 215 of FIGS. 2, 3, and 4, the multiplexer circuitry 225 of FIGS. 2, 3, and 4, the coefficient filter circuitry 235 of FIGS. 2, 3, and 4, the noise detection circuitry 245 of FIGS. 2, 3, and 4, or more generally the frequency tracking circuitry 115, 200, 300, 400 of FIGS. 1, 2, 3, and 4.

The programmable circuitry 812 of the illustrated example includes a local memory 813 (e.g., a cache, registers, etc.). The programmable circuitry 812 of the illustrated example is in communication with main memory 814, 816, which includes a volatile memory 814 and a non-volatile memory 816, by a bus 818. The volatile memory 814 may be implemented by one or more Synchronous Dynamic Random Access Memory (SDRAM), Dynamic Random Access Memory (DRAM), RAMBUS® Dynamic Random Access Memory (RDRAM®), or any other type of RAM device. The non-volatile memory 816 may be implemented by one or a combination of flash memory or any other desired type of memory device. Access to the main memory 814, 816 of the illustrated examples is controlled by a memory controller 817. In some examples, the memory controller 817 may be implemented by one or more integrated circuits, logic circuits, microcontrollers from any desired family or manufacturer, or any other type of circuitry to manage the flow of data going to and from the main memory 814, 816.

The programmable circuitry platform 800 of the illustrated example also includes interface circuitry 820. The interface circuitry 820 may be implemented by hardware in according to any type of interface standard, such as an Ethernet interface, a universal serial bus (USB) interface, a Bluetooth® interface, a near field communication (NFC) interface, a Peripheral Component Interconnect (PCI) interface, or a Peripheral Component Interconnect Express (PCIe) interface.

In the illustrated example, one or more input devices 822 are connected to the interface circuitry 820. The input device(s) 822 permit(s) a user (e.g., a human user, a machine user, etc.) to enter one of or a combination of data or commands into the programmable circuitry 812. The input device(s) 822 can be implemented by, for example, one of or a combination of an audio sensor, a microphone, a camera (still or video), a keyboard, a button, a mouse, a touchscreen, a trackpad, a trackball, an isopoint device, or a voice recognition system.

One or more output devices 824 are also connected to the interface circuitry 820 of the illustrated example. The output device(s) 824 can be implemented, for example, by one of or a combination of display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, or speaker. The interface circuitry 820 of the illustrated example, thus, includes one of or a combination of a graphics driver card, a graphics driver chip, or graphics processor circuitry such as a GPU.

The interface circuitry 820 of the illustrated example also includes a communication device such as one of or a combination of a transmitter, a receiver, a transceiver, a modem, a residential gateway, a wireless access point, or a network interface to facilitate exchange of data with external machines (e.g., computing devices of any kind) by a network 826. The communication can be by, for example, an Ethernet connection, a digital subscriber line (DSL) connection, a telephone line connection, a coaxial cable system, a satellite system, a beyond-line-of-sight wireless system, a line-of-sight wireless system, a cellular telephone system, an optical connection, etc.

The programmable circuitry platform 800 of the illustrated example also includes one or more mass storage discs or devices 828 to store one or more of firmware, software, or data. Examples of such mass storage discs or devices 828 include one or more magnetic storage devices (e.g., floppy disk, drives, HDDs, etc.), optical storage devices (e.g., Blu-ray disks, CDs, DVDs, etc.), RAID systems, or solid-state storage discs or devices such as flash memory devices and SSDs.

The machine-readable instructions 832, which may be implemented by the machine-readable instructions of FIGS. 5A and 5B, may be stored in one of or a combination of the mass storage device 828, in the volatile memory 814, in the non-volatile memory 816, or on at least one non-transitory computer readable storage medium such as a CD or DVD which may be removable.

Figure 9:
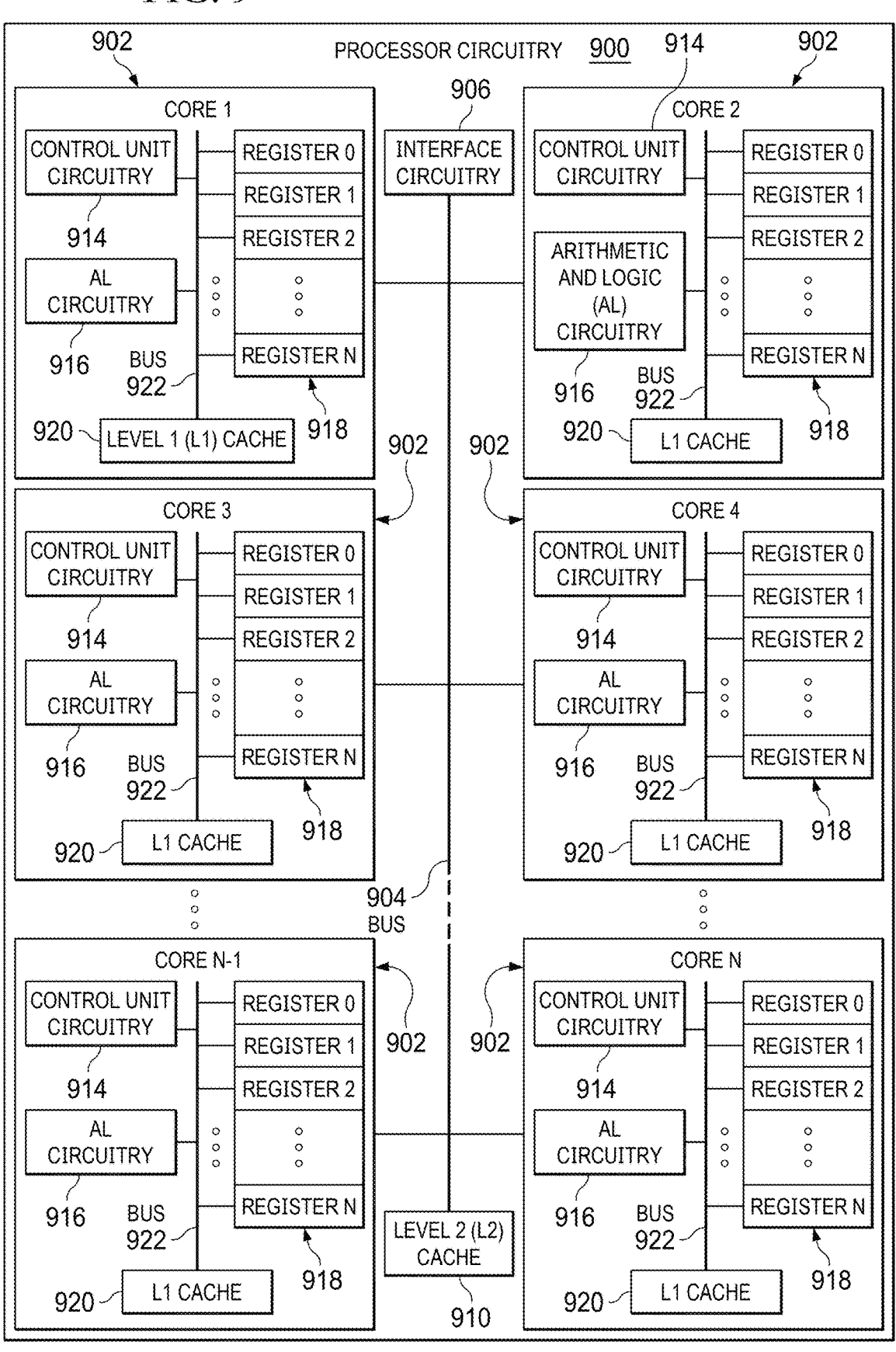
FIG. 9 is a block diagram of an example implementation of the programmable circuitry of FIG. 8.

FIG. 9 is a block diagram of an example implementation of the programmable circuitry 812 of FIG. 8. In this example, the programmable circuitry 812 of FIG. 8 is implemented by a microprocessor 900. For example, the microprocessor 900 may be a general-purpose microprocessor (e.g., general-purpose microprocessor circuitry). The microprocessor 900 executes some or all of the machine-readable instructions of the flowcharts of FIGS. 5A and 5B to effectively instantiate the circuitry of FIGS. 2, 3, and 4 as logic circuits to perform operations corresponding to those machine-readable instructions. In some such examples, the circuitry of FIGS. 1, 2, 3, and 4 is instantiated by the hardware circuits of the microprocessor 900 in combination with the machine-readable instructions. For example, the microprocessor 900 may be implemented by multi-core hardware circuitry such as a CPU, a DSP, a GPU, an XPU, etc. Although it may include any number of example cores 902 (e.g., 1 core), the microprocessor 900 of this example is a multi-core semiconductor device including N cores. The cores 902 of the microprocessor 900 may operate independently or may cooperate to execute machine-readable instructions. For example, machine code corresponding to a firmware program, an embedded software program, or a software program may be executed by one of the cores 902 or may be executed by multiple ones of the cores 902 at the same or different times. In some examples, the machine code corresponding to the firmware program, the embedded software program, or the software program is split into threads and executed in parallel by two or more of the cores 902. The software program may correspond to a portion or all of the machine-readable instructions or operations represented by the flowcharts of FIGS. 5A and 5B.

The cores 902 may communicate by a first example bus 904. In some examples, the first bus 904 may be implemented by a communication bus to effectuate communication associated with one(s) of the cores 902. For example, the first bus 904 may be implemented by at least one of an Inter-Integrated Circuit (I2C) bus, a Serial Peripheral Interface (SPI) bus, a PCI bus, or a PCIe bus. Also or alternatively, the first bus 904 may be implemented by any other type of computing or electrical bus. The cores 902 may obtain data, instructions, and signals from one or more external devices by example interface circuitry 906. The cores 902 may output data, instructions, and signals to the one or more external devices by the interface circuitry 906. Although the cores 902 of this example include example local memory 920 (e.g., Level 1 (L1) cache that may be split into an L1 data cache and an L1 instruction cache), the microprocessor 900 also includes example shared memory 910 that may be shared by the cores (e.g., Level 2 (L2 cache)) for high-speed access to data and instructions. Data and instructions may be transferred (e.g., shared) by one of or a combination of writing to or reading from the shared memory 910. The local memory 920 of each of the cores 902 and the shared memory 910 may be part of a hierarchy of storage devices including multiple levels of cache memory and the main memory (e.g., the main memory 814, 816 of FIG. 8). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 902 may be referred to as a CPU, DSP, GPU, etc., or any other type of hardware circuitry. Each core 902 includes control unit circuitry 914, arithmetic and logic (AL) circuitry (sometimes referred to as an ALU) 916, a plurality of registers 918, the local memory 920, and a second example bus 922. Other structures may be present. For example, each core 902 may include vector unit circuitry, single instruction multiple data (SIMD) unit circuitry, load/store unit (LSU) circuitry, branch/jump unit circuitry, floating-point unit (FPU) circuitry, etc. The control unit circuitry 914 includes semiconductor-based circuits structured to control (e.g., coordinate) data movement within the corresponding core 902. The AL circuitry 916 includes semiconductor-based circuits structured to perform one or more mathematic or logic operations on the data within the corresponding core 902. The AL circuitry 916 of some examples performs integer-based operations. In other examples, the AL circuitry 916 also performs floating-point operations. In yet other examples, the AL circuitry 916 may include first AL circuitry that performs integer-based operations and second AL circuitry that performs floating-point operations. In some examples, the AL circuitry 916 may be referred to as an Arithmetic Logic Unit (ALU).

The registers 918 are semiconductor-based structures to store data and instructions such as results of one or more of the operations performed by the AL circuitry 916 of the corresponding core 902. For example, the registers 918 may include vector register(s), SIMD register(s), general-purpose register(s), flag register(s), segment register(s), machine-specific register(s), instruction pointer register(s), control register(s), debug register(s), memory management register(s), machine check register(s), etc. The registers 918 may be arranged in a bank as shown in FIG. 9. Alternatively, the registers 918 may be organized in any other arrangement, format, or structure, such as by being distributed throughout the core 902 to shorten access time. The second bus 922 may be implemented by at least one of an I2C bus, a SPI bus, a PCI bus, or a PCIe bus.

Each core 902 or, more generally, the microprocessor 900 may include additional or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) or other circuitry may be present. The microprocessor 900 is a semiconductor device fabricated to include many transistors interconnected to implement the structures described above in one or more integrated circuits (ICs) contained in one or more packages.

The microprocessor 900 may include or cooperate with one or more accelerators (e.g., acceleration circuitry, hardware accelerators, etc.). In some examples, accelerators are implemented by logic circuitry to perform certain tasks more quickly and efficiently than can be done by a general-purpose processor. Examples of accelerators include ASICs and FPGAs such as those discussed herein. A GPU, DSP, or other programmable device can also be an accelerator. Accelerators may be on-board the microprocessor 900, in the same chip package as the microprocessor 900, or in one or more separate packages from the microprocessor 900.

Figure 10:
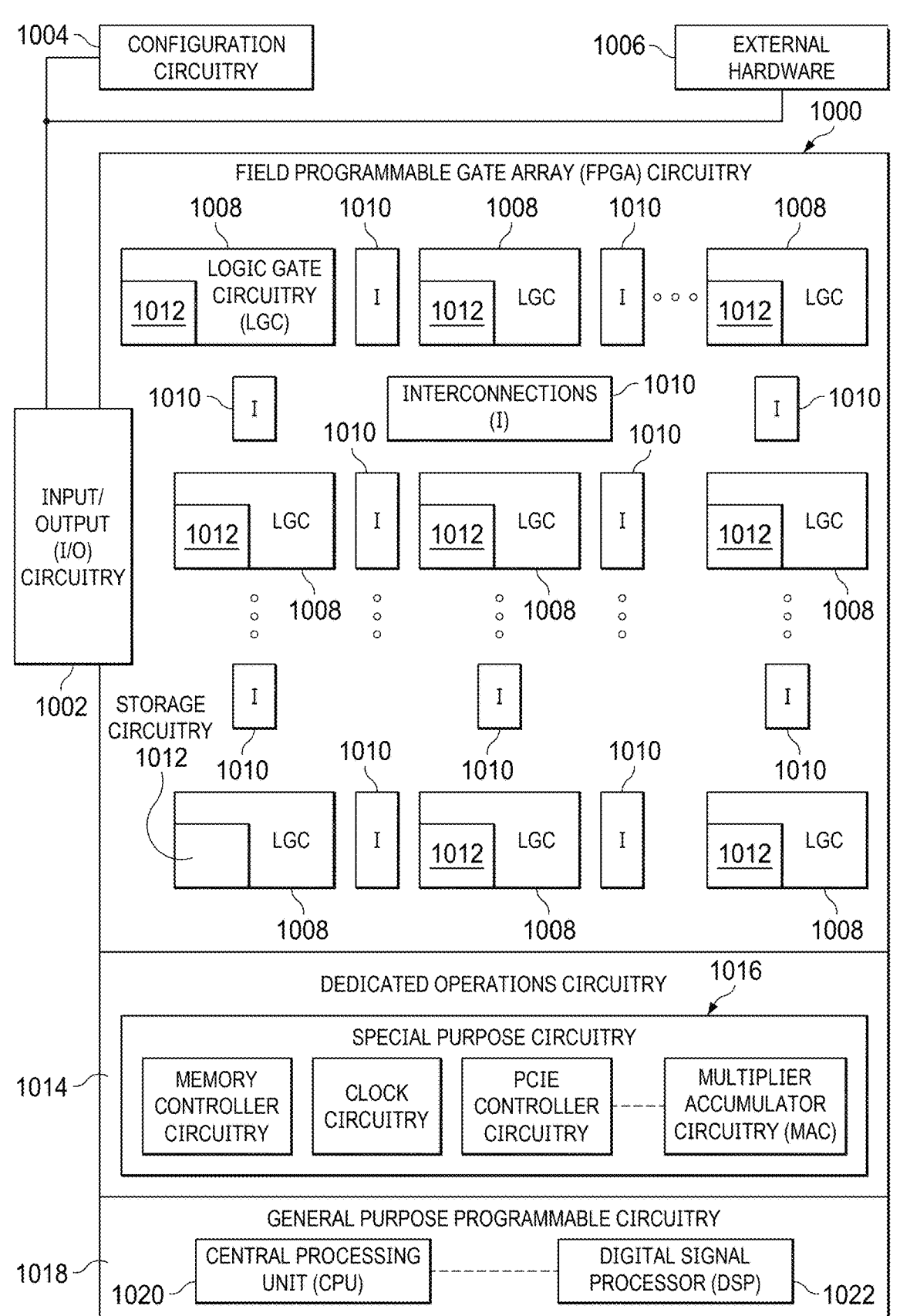
FIG. 10 is a block diagram of another example implementation of the programmable circuitry of FIG. 8.

FIG. 10 is a block diagram of another example implementation of the programmable circuitry 812 of FIG. 8. In this example, the programmable circuitry 812 is implemented by FPGA circuitry 1000. For example, the FPGA circuitry 1000 may be implemented by an FPGA. The FPGA circuitry 1000 can be used, for example, to perform operations that could otherwise be performed by the example microprocessor 900 of FIG. 9 executing corresponding machine-readable instructions. However, once configured, the FPGA circuitry 1000 instantiates the operations and functions corresponding to the machine-readable instructions in hardware and, thus, can often execute the operations/functions faster than they could be performed by a general-purpose microprocessor executing the corresponding software.

More specifically, in contrast to the microprocessor 900 of FIG. 9 described above (which is a general purpose device that may be programmed to execute some or all of the machine-readable instructions represented by the flowchart(s) of FIGS. 5A and 5B but whose interconnections and logic circuitry are fixed once fabricated), the FPGA circuitry 1000 of the example of FIG. 10 includes interconnections and logic circuitry that may be one of or a combination of configured, structured, programmed, and interconnected in different ways after fabrication to instantiate, for example, some or all of the operations/functions corresponding to the machine-readable instructions represented by the flowchart(s) of FIGS. 5A and 5B. In particular, the FPGA circuitry 1000 may be thought of as an array of logic gates, interconnections, and switches. The switches can be programmed to change how the logic gates are interconnected by the interconnections, effectively forming one or more dedicated logic circuits (unless and until the FPGA circuitry 1000 is reprogrammed). The configured logic circuits enable the logic gates to cooperate in different ways to perform different operations on data received by input circuitry. Those operations may correspond to some or all of the instructions (e.g., the software and/or firmware) represented by the flowchart(s) of FIGS. 5A and 5B. As such, the FPGA circuitry 1000 may be at least one of configured or structured to effectively instantiate some or all of the operations/functions corresponding to the machine-readable instructions of the flowchart(s) of FIGS. 5A and 5B as dedicated logic circuits to perform the operations/functions corresponding to those software instructions in a dedicated manner analogous to an ASIC. Therefore, the FPGA circuitry 1000 may perform the operations/functions corresponding to the some or all of the machine-readable instructions of FIGS. 5A and 5B faster than the general-purpose microprocessor can execute the same.

In the example of FIG. 10, the FPGA circuitry 1000 is at least one of configured or structured in response to being programmed (and/or reprogrammed one or more times) based on a binary file. In some examples, the binary file may be one of or both of compiled or generated based on instructions in a hardware description language (HDL) such as Lucid, Very High-Speed Integrated Circuits (VHSIC) Hardware Description Language (VHDL), or Verilog. For example, a user (e.g., a human user, a machine user, etc.) may write code or a program corresponding to one or more operations/functions in an HDL; the code/program may be translated into a low-level language as needed; and the code/program (e.g., the code/program in the low-level language) may be converted (e.g., by a compiler, a software application, etc.) into the binary file. In some examples, the FPGA circuitry 1000 of FIG. 10 may at least one of access or load the binary file to cause the FPGA circuitry 1000 of FIG. 10 to be at least one of configured or structured to perform the one or more operations/functions. For example, the binary file may be implemented by one of or a combination of a bit stream (e.g., one or more computer-readable bits, one or more machine-readable bits, etc.), data (e.g., computer-readable data, machine-readable data, etc.), or machine-readable instructions accessible to the FPGA circuitry 1000 of FIG. 10 to at least one of configure or structure the FPGA circuitry 1000 of FIG. 10, or portion(s) thereof.

In some examples, the binary file is at least one of compiled, generated, transformed, or otherwise output from a uniform software platform utilized to program FPGAs. For example, the uniform software platform may translate first instructions (e.g., code or a program) that correspond to one or more operations/functions in a high-level language (e.g., C, C++, Python, etc.) into second instructions that correspond to the one or more operations/functions in an HDL. In some such examples, the binary file is at least one of compiled, generated, or otherwise output from the uniform software platform based on the second instructions. In some examples, the FPGA circuitry 1000 of FIG. 10 may at least one of access or load the binary file to cause the FPGA circuitry 1000 of FIG. 10 to be at least one of configured or structured to perform the one or more operations/functions. For example, the binary file may be implemented by one of or a combination of a bit stream (e.g., one or more computer-readable bits, one or more machine-readable bits, etc.), data (e.g., computer-readable data, machine-readable data, etc.), or machine-readable instructions accessible to the FPGA circuitry 1000 of FIG. 10 to at least one of configure or structure the FPGA circuitry 1000 of FIG. 10, or portion(s) thereof.

The FPGA circuitry 1000 of FIG. 10, includes example input/output (I/O) circuitry 1002 to at least one of obtain or output data to/from at least one of example configuration circuitry 1004 or external hardware 1006. For example, the configuration circuitry 1004 may be implemented by interface circuitry that may obtain a binary file, which may be implemented by one or more of a bit stream, data, or machine-readable instructions, to configure the FPGA circuitry 1000, or portion(s) thereof. In some such examples, the configuration circuitry 1004 may obtain the binary file from one of or a combination of a user, a machine (e.g., hardware circuitry (e.g., programmable or dedicated circuitry) that may implement an Artificial Intelligence/Machine Learning (AI/ML) model to generate the binary file, etc.), or any combination(s) thereof). In some examples, the external hardware 1006 may be implemented by external hardware circuitry. For example, the external hardware 1006 may be implemented by the microprocessor 900 of FIG. 9.

The FPGA circuitry 1000 also includes an array of example logic gate circuitry 1008, a plurality of example configurable interconnections 1010, and example storage circuitry 1012. The logic gate circuitry 1008 and the configurable interconnections 1010 are configurable to instantiate one or more operations/functions that may correspond to at least some of the machine-readable instructions of FIGS. 5A and 5B and/or other desired operations. The logic gate circuitry 1008 shown in FIG. 10 is fabricated in blocks or groups. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 1008 to enable configuration of one of or a combination of the electrical structures or the logic gates to form circuits to perform desired operations/functions. The logic gate circuitry 1008 may include other electrical structures such as look-up tables (LUTs), registers (e.g., flip-flops or latches), multiplexers, etc.

The configurable interconnections 1010 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1008 to program desired logic circuits.

The storage circuitry 1012 of the illustrated example is structured to store result(s) of the one or more of the operations performed by corresponding logic gates. The storage circuitry 1012 may be implemented by registers or the like. In the illustrated example, the storage circuitry 1012 is distributed amongst the logic gate circuitry 1008 to facilitate access and increase execution speed.

The example FPGA circuitry 1000 of FIG. 10 also includes example dedicated operations circuitry 1014. In this example, the dedicated operations circuitry 1014 includes special purpose circuitry 1016 that may be invoked to implement commonly used functions to avoid the need to program those functions in the field. Examples of such special purpose circuitry 1016 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1000 may also include example general purpose programmable circuitry 1018 such as an example CPU 1020 or an example DSP 1022. Other general purpose programmable circuitry 1018 may also or alternatively be present such as a GPU, an XPU, etc., that can be programmed to perform other operations.

Although FIGS. 9 and 10 illustrate two example implementations of the programmable circuitry 812 of FIG. 8, many other approaches are contemplated. For example, FPGA circuitry may include an on-board CPU, such as one or more of the example CPU 1020 of FIG. 9. Therefore, the programmable circuitry 812 of FIG. 8 may also be implemented by combining at least the example microprocessor 900 of FIG. 9 and the example FPGA circuitry 1000 of FIG. 10. In some such hybrid examples, one or more cores 902 of FIG. 9 may execute a first portion of the machine-readable instructions represented by the flowchart(s) of FIGS. 5A and 5B to perform first operation(s)/function(s), the FPGA circuitry 1000 of FIG. 10 may be at least one of configured or structured to perform second operation(s)/function(s) corresponding to a second portion of the machine-readable instructions represented by the flowcharts of FIG. [Flowcharts], and/or an ASIC may be at least one of configured or structured to perform third operation(s)/function(s) corresponding to a third portion of the machine-readable instructions represented by the flowcharts of FIGS. 5A and 5B.

Some or all of the circuitry of FIGS. 1, 2, 3, and 4 may, thus, be instantiated at the same or different times. For example, same and/or different portion(s) of the microprocessor 900 of FIG. 9 may be programmed to execute portion(s) of machine-readable instructions at the same and/or different times. In some examples, same and/or different portion(s) of the FPGA circuitry 1000 of FIG. 10 may be at least one of configured or structured to perform operations/functions corresponding to portion(s) of machine-readable instructions at the same and/or different times.

In some examples, some or all of the circuitry of FIGS. 1, 2, 3, and 4 may be instantiated, for example, in one or more threads executing concurrently and/or in series. For example, the microprocessor 900 of FIG. 9 may execute machine-readable instructions in one or more threads executing concurrently and/or in series. In some examples, the FPGA circuitry 1000 of FIG. 10 may be at least one of configured or structured to carry out operations/functions concurrently and/or in series. Moreover, in some examples, some or all of the circuitry of FIGS. 1, 2, 3, and 4 may be implemented within one or more virtual machines or containers executing on the microprocessor 900 of FIG. 9.

In some examples, the programmable circuitry 812 of FIG. 8 may be in one or more packages. For example, at least one of the microprocessor 900 of FIG. 9 or the FPGA circuitry 1000 of FIG. 10 may be in one or more packages. In some examples, an XPU may be implemented by the programmable circuitry 812 of FIG. 8, which may be in one or more packages. For example, the XPU may include a CPU (e.g., the microprocessor 900 of FIG. 9, the CPU 1020 of FIG. 10, etc.) in one package, a DSP (e.g., the DSP 1022 of FIG. 10) in another package, a GPU in yet another package, and an FPGA (e.g., the FPGA circuitry 1000 of FIG. 10) in still yet another package.

While an example manner of implementing the frequency tracking circuitry 115, 200, 300, 400 of FIG. 1 is illustrated in FIGS. 1, 2, 3, and 4, one or more of the elements, processes, or devices illustrated in FIGS. 1, 2, 3, and 4 may be combined, divided, re-arranged, omitted, eliminated, or implemented in any other way. Further, the period calculator circuitry 205 of FIGS. 2, 3, and 4, the averaging circuitry 215 of FIGS. 2, 3, and 4, the multiplexer circuitry 225 of FIGS. 2, 3, and 4, the coefficient filter circuitry 235 of FIGS. 2, 3, and 4, the noise detection circuitry 245 of FIGS. 2, 3, and 4, or more generally the frequency tracking circuitry 115, 200, 300, 400 of FIGS. 1, 2, 3, and 4, may be implemented by hardware alone or by hardware in combination with software and firmware. Thus, for example, any of the period calculator circuitry 205 of FIGS. 2, 3, and 4, the averaging circuitry 215 of FIGS. 2, 3, and 4, the multiplexer circuitry 225 of FIGS. 2, 3, and 4, the coefficient filter circuitry 235 of FIGS. 2, 3, and 4, the noise detection circuitry 245 of FIGS. 2, 3, and 4, or more generally the frequency tracking circuitry 115, 200, 300, 400 of FIGS. 1, 2, 3, and 4, could be implemented by programmable circuitry in combination with one or more machine-readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), or field programmable logic device(s) (FPLD(s)) such as FPGAs. Further still, the example frequency tracking circuitry 115, 200, 300, 400 of FIGS. 1, 2, 3, and 4 may include one or more elements, processes, or devices in addition to, or instead of, those illustrated in FIGS. 1, 2, 3, and 4, or may include more than one of any or all of the illustrated elements, processes and devices.

The flowchart is representative of example machine-readable instructions, which may be executed by programmable circuitry to at least one of implement or instantiate the frequency tracking circuitry 115, 200, 300, 400 of FIGS. 1, 2, 3, and 4 or representative of example operations which may be performed by programmable circuitry to at least one of implement or instantiate the frequency tracking circuitry 115, 200, 300, 400 of FIGS. 1, 2, 3, and 4, are shown in FIGS. 5A and 5B. The machine-readable instructions may be one or more executable programs or portion(s) of one or more executable programs for execution by programmable circuitry such as the programmable circuitry 812 shown in the example processor platform 800 discussed below in connection with FIG. 8 and may be one or more function(s) or portion(s) of functions to be performed by the example programmable circuitry (e.g., an FPGA) discussed below in connection with FIG. 9 or 10. In some examples, the machine-readable instructions cause an operation, a task, etc., to be carried out or performed in an automated manner in the real-world. As used herein, "automated" means without human involvement.

The program may be embodied in instructions (e.g., software and/or firmware) stored on one or more non-transitory computer readable and/or machine-readable storage medium such as one of or a combination of cache memory, a magnetic-storage device or disk (e.g., a floppy disk, a Hard Disk Drive (HDD), etc.), an optical-storage device or disk (e.g., a Blu-ray disk, a Compact Disk (CD), a Digital Versatile Disk (DVD), etc.), a Redundant Array of Independent Disks (RAID), a register, ROM, a solid-state drive (SSD), SSD memory, non-volatile memory (e.g., electrically erasable programmable read-only memory (EE-PROM), flash memory, etc.), volatile memory (e.g., Random Access Memory (RAM) of any type, etc.), or any other storage device or storage disk. The instructions of the non-transitory computer readable and/or machine-readable medium may program or be executed by programmable circuitry located in one or more hardware devices, but the entire program or parts thereof could alternatively be executed or instantiated by one or more hardware devices other than the programmable circuitry or embodied in dedicated hardware. The machine-readable instructions may be distributed across multiple hardware devices or executed by two or more hardware devices (e.g., a server and a client hardware device). For example, the client hardware device may be implemented by an endpoint client hardware device (e.g., a hardware device associated with a human and/or machine user) or an intermediate client hardware device gateway (e.g., a radio access network (RAN)) that may facilitate communication between a server and an endpoint client hardware device. Similarly, the non-transitory computer readable storage medium may include one or more mediums. Further, although the example program is described with reference to the flowchart illustrated in FIGS. 5A and 5B, many other methods of implementing the example frequency tracking circuitry 115, 200, 300, 400 may alternatively be used. For example, the order of execution of the blocks of the flowchart(s) may be changed, or some of the blocks described may be changed, eliminated, or combined. Also or alternatively, any or all of the blocks of the flow chart may be implemented by one or more hardware circuits (e.g., processor circuitry, discrete, integrated analog and/or digital circuitry, an FPGA, an ASIC, a comparator, an operational-amplifier (op-amp), a logic circuit, etc.) structured to perform the corresponding operation without executing software or firmware. The programmable circuitry may be distributed in different network locations or local to one or more hardware devices (e.g., a single-core processor (e.g., a single core CPU), a multi-core processor (e.g., a multi-core CPU, an XPU, etc.)). For example, the programmable circuitry may be one of or a combination of a CPU or an FPGA located in the same package (e.g., the same integrated circuit (IC) package or in two or more separate housings), one or more processors in a single machine, multiple processors distributed across multiple servers of a server rack, multiple processors distributed across one or more server racks, etc., or any combination(s) thereof.

The machine-readable instructions described herein may be stored in one or more of a compressed format, an encrypted format, a fragmented format, a compiled format, an executable format, a packaged format, etc. Machine readable instructions as described herein may be stored as data (e.g., computer-readable data, machine-readable data, one or more bits (e.g., one or more computer-readable bits, one or more machine-readable bits, etc.), a bitstream (e.g., a computer-readable bitstream, a machine-readable bitstream, etc.), etc.) or a data structure (e.g., as portion(s) of instructions, code, representations of code, etc.) that may be utilized to create, manufacture, or produce machine executable instructions. For example, the machine-readable instructions may be fragmented and stored on one or more storage devices, disks or computing devices (e.g., servers) located at the same or different locations of a network or collection of networks (e.g., in the cloud, in edge devices, etc.). The machine-readable instructions may require one or more of installation, modification, adaptation, updating, combining, supplementing, configuring, decryption, decompression, unpacking, distribution, reassignment, compilation, etc., in order to make them directly readable, interpretable, or executable by a computing device or other machine. For example, the machine-readable instructions may be stored in multiple parts, which are individually compressed, encrypted, or stored on separate computing devices, wherein the parts when decrypted, decompressed, or combined form a set of one or more computer-executable or machine executable instructions that implement one or more functions or operations that may together form a program such as that described herein.

In another example, the machine-readable instructions may be stored in a state in which they may be read by programmable circuitry, but require addition of a library (e.g., a dynamic link library (DLL)), a software development kit (SDK), an application programming interface (API), etc., in order to execute the machine-readable instructions on a particular computing device or other device. In another example, the machine-readable instructions may need to be configured (e.g., settings stored, data input, network addresses recorded, etc.) before the machine-readable instructions or the corresponding program(s) can be executed in whole or in part. Thus, machine-readable, computer readable or machine-readable media, as used herein, may include one or a combination of instructions and program(s) regardless of the particular format or state of the machine-readable instructions or program(s).

The machine-readable instructions described herein can be represented by any past, present, or future instruction language, scripting language, programming language, etc. For example, the machine-readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 5A and 5B may be implemented using executable instructions (e.g., computer readable and/or machine-readable instructions) stored on one or more non-transitory computer readable or machine-readable media. As used herein, the terms non-transitory computer readable medium, non-transitory computer readable storage medium, non-transitory machine-readable medium, and non-transitory machine-readable storage medium are expressly defined to include any type of computer readable storage device or storage disk and to exclude propagating signals and to exclude transmission media. Examples of such non-transitory computer readable medium, non-transitory computer readable storage medium, non-transitory machine-readable medium, or non-transitory machine-readable storage medium include one or more optical storage devices, magnetic storage devices, an HDD, a flash memory, a read-only memory (ROM), a CD, a DVD, a cache, a RAM of any type, a register, or any other storage device or storage disk in which information is stored for any duration (e.g., for extended time periods, permanently, for brief instances, for temporarily buffering, for caching of the information). As used herein, the terms "non-transitory computer readable storage device" and "non-transitory machine-readable storage device" are defined to include any physical (mechanical, magnetic, electromechanical, or electrical) hardware to retain information for a time period, but to exclude propagating signals and to exclude transmission media. Examples of non-transitory computer readable storage devices or non-transitory machine-readable storage devices include one or a combination of random-access memory of any type, read only memory of any type, solid state memory, flash memory, optical discs, magnetic disks, disk drives, or redundant array of independent disks (RAID) systems. As used herein, the term "device" refers to physical structure such as one of or a combination of mechanical, electromechanical, or electrical equipment, hardware, or circuitry that may or may not be configured by computer readable instructions, machine-readable instructions, etc., or manufactured to execute computer-readable instructions, machine-readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and things, the phrase "at least one of A and B" refers to implementations including any of (1) at least one A, (2) at least one B, or (3) at least one A and at least one B. Similarly, as used herein in the context of describing structures, components, items, objects and things, the phrase "at least one of A or B" refers to implementations including any of (1) at least one A, (2) at least one B, or (3) at least one A and at least one B. As used herein in the context of describing the performance or execution of processes, instructions, actions, activities, etc., the phrase "at least one of A and B" refers to implementations including any of (1) at least one A, (2) at least one B, or (3) at least one A and at least one B. Similarly, as used herein in the context of describing the performance or execution of processes, instructions, actions, activities, etc., the phrase "at least one of A or B" refers to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is at least one of not feasible or advantageous.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by at least one of the connection reference or relative movement between those elements unless otherwise indicated. As such, connection references do not necessarily infer that two elements are directly connected or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, or ordering in any way, but are merely used as at least one of labels or arbitrary names to distinguish elements for ease of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to at least one of manufacturing tolerances or other real-world imperfections. For example, "approximately" and "about" may indicate such dimensions may be within a tolerance range of +/−10% unless otherwise specified herein.

As used herein, the phrase "in communication," including variations thereof, encompasses one of or a combination of direct communication or indirect communication through one or more intermediary components, and does not require direct physical (e.g., wired) communication or constant communication, but rather also includes selective communication at least one of periodic intervals, scheduled intervals, aperiodic intervals, or one-time events.

As used herein, "programmable circuitry" is defined to include at least one of (i) one or more special purpose electrical circuits (e.g., an application specific circuit (ASIC)) structured to perform specific operation(s) and including one or more semiconductor-based logic devices (e.g., electrical hardware implemented by one or more transistors), or (ii) one or more general purpose semiconductor-based electrical circuits programmable with instructions to perform one or more specific functions(s) or operation(s) and including one or more semiconductor-based logic devices (e.g., electrical hardware implemented by one or more transistors). Examples of programmable circuitry include programmable microprocessors such as Central Processor Units (CPUs) that may execute first instructions to perform one or more operations or functions, Field Programmable Gate Arrays (FPGAs) that may be programmed with second instructions to at least one of configure or structure the FPGAs to instantiate one or more operations or functions corresponding to the first instructions, Graphics Processor Units (GPUs) that may execute first instructions to perform one or more operations or functions, Digital Signal Processors (DSPs) that may execute first instructions to perform one or more operations or functions, XPUs, Network Processing Units (NPUs) one or more microcontrollers that may execute first instructions to perform one or more operations or functions or integrated circuits such as Application Specific Integrated Circuits (ASICs). For example, an XPU may be implemented by a heterogeneous computing system including multiple types of programmable circuitry (e.g., one or more FPGAs, one or more CPUs, one or more GPUs, one or more NPUs, one or more DSPs, etc., and any combination(s) thereof), and orchestration technology (e.g., application programming interface(s) (API(s)) that may assign computing task(s) to whichever one(s) of the multiple types of programmable circuitry is/are suited and available to perform the computing task(s).

As used herein integrated circuit/circuitry is defined as one or more semiconductor packages containing one or more circuit elements such as transistors, capacitors, inductors, resistors, current paths, diodes, etc. For example, an integrated circuit may be implemented as one or more of an ASIC, an FPGA, a chip, a microchip, programmable circuitry, a semiconductor substrate coupling multiple circuit elements, a system on chip (SoC), etc.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., at least one of programmed or hardwired) at a time of manufacturing by a manufacturer to at least one of perform the function or be configurable (or re-configurable) by a user after manufacturing to perform the function/or other additional or alternative functions. The configuring may be through at least one of firmware or software programming of the device, through at least one of a construction or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

In the description and claims, described "circuitry" may include one or more circuits. A circuit or device that is described herein as including certain components may instead be adapted to be coupled to those components to form the described circuitry or device. For example, a structure described as including one or more semiconductor elements (such as transistors), one or more passive elements (such as one of or a combination of resistors, capacitors, or inductors), or one or more sources (such as voltage and/or current sources) may instead include only the semiconductor elements within a single physical device (e.g., at least one of a semiconductor die or integrated circuit (IC) package) and may be adapted to be coupled to at least some of the passive elements or the sources to form the described structure either at a time of manufacture or after a time of manufacture, for example, by at least one of an end-user or a third-party.

Circuits described herein are reconfigurable to include the replaced components to provide functionality at least partially similar to functionality available prior to the component replacement. Components shown as resistors, unless otherwise stated, are generally representative of any one or more elements coupled in at least one of series or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and some features illustrated as being internal to the integrated circuit may be incorporated outside of the integrated. As used herein, the term "integrated circuit" means one or more circuits that are at least one of: (i) incorporated in/over a semiconductor substrate; (ii) incorporated in a single semiconductor package; (iii) incorporated into the same module; or (iv) incorporated in/on the same printed circuit board.

Uses of the phrase "ground" in the foregoing description include at least one of a chassis ground, an Earth ground, a floating ground, a virtual ground, a digital ground, a common ground, or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero.

Modifications are possible in the described embodiments, and other embodiments are possible, within the scope of the claims.

What is claimed is:

1. An apparatus comprising:
first oscillator circuitry;
second oscillator circuitry;
period calculator circuitry coupled to the first oscillator circuitry and coupled to the second oscillator circuitry;
averaging circuitry coupled to the period calculator circuitry;
coefficient filter circuitry coupled to the averaging circuitry; and
multiplexer circuitry including a first input coupled to the period calculator circuitry, a second input coupled to the averaging circuitry, and an output coupled to the coefficient filter circuitry.

2. The apparatus of claim 1, wherein the averaging circuitry includes an input coupled to the period calculator circuitry and coupled to the first input of the multiplexer circuitry.

3. The apparatus of claim 1, further comprising noise detection circuitry including:
a first input coupled to the averaging circuitry;
a second input coupled to the coefficient filter circuitry; and
an output coupled to the second input of the coefficient filter circuitry.

4. The apparatus of claim 3, wherein the noise detection circuitry includes:
detection threshold circuitry;
combination circuitry coupled to the averaging circuitry and coupled to the coefficient filter circuitry; and
comparator circuitry coupled to the detection threshold circuitry, coupled to the combination circuitry, coupled to the averaging circuitry, and coupled to the coefficient filter circuitry.

5. The apparatus of claim 4,
wherein the combination circuitry is configurable to generate an error value based on a difference between a first value received from the averaging circuitry and a second value received from the coefficient filter circuitry, and
wherein the comparator circuitry is configurable to:
receive a threshold value from the detection threshold circuitry; and
compare the error value to the threshold value.

6. The apparatus of claim 1, wherein the period calculator circuitry is configurable to generate a value based on a ratio of:
a frequency of the first oscillator circuitry; and
a frequency of the second oscillator circuitry.

7. The apparatus of claim 1, further comprising real-time clock (RTC) accumulator circuitry coupled to the first oscillator circuitry and coupled to the coefficient filter circuitry.

8. The apparatus of claim 7, further comprising:
programmable circuitry coupled to the RTC accumulator circuitry; and
interface circuitry coupled to the programmable circuitry.

9. The apparatus of claim 1, further comprising:
coefficient circuitry coupled to the coefficient filter circuitry; and
programmable circuitry coupled to the period calculator circuitry, coupled to the averaging circuitry, and coupled to the coefficient circuitry.

10. An apparatus comprising:
period calculator circuitry including an output;
averaging circuitry including an output and coupled to the output of the period calculator circuitry;
noise detection circuitry coupled to the output of the averaging circuitry; and
coefficient filter circuitry including an output coupled to the noise detection circuitry.

11. The apparatus of claim 10, wherein the coefficient filter circuitry is coupled to the output of the averaging circuitry.

12. The apparatus of claim 10, wherein the noise detection circuitry includes an output coupled to the coefficient filter circuitry.

13. The apparatus of claim 10, wherein the noise detection circuitry includes:
detection threshold circuitry;
combination circuitry coupled to the averaging circuitry and coupled to the coefficient filter circuitry; and
comparator circuitry coupled to the detection threshold circuitry, coupled to the combination circuitry, coupled to the averaging circuitry, and coupled to the coefficient filter circuitry.

14. The apparatus of claim 13,
wherein the combination circuitry is configurable to generate an error value based on a difference between a first value received from the averaging circuitry and a second value received from the coefficient filter circuitry, and
wherein the comparator circuitry is configurable to:
receive a threshold value from the detection threshold circuitry; and
compare the error value to the threshold value.

15. The apparatus of claim 10, further comprising:
coefficient circuitry coupled to the coefficient filter circuitry; and
programmable circuitry coupled to the period calculator circuitry, coupled to the averaging circuitry, and coupled to the coefficient circuitry.

16. The apparatus of claim 10, further comprising:
first oscillator circuitry coupled to the period calculator circuitry;
second oscillator circuitry coupled to the period calculator circuitry;
real-time clock (RTC) accumulator circuitry; and
clock controller circuitry coupled to the coefficient filter circuitry, the first oscillator circuitry, the second oscillator circuitry, and the RTC accumulator circuitry, the clock controller circuitry is configurable to:
determine whether the apparatus is in a standby mode;
when not in the standby mode, increment a value of the RTC accumulator circuitry based on the first oscillator circuitry; and
when in the standby mode, increment the value of the RTC accumulator circuitry by a count of the coefficient filter circuitry.

17. An apparatus comprising:
period calculator circuitry configurable to determine a number of cycles of a first signal in a period of a second signal;
averaging circuitry coupled to the period calculator circuitry and configurable to determine an average of the number of cycles of the first signal in a plurality of periods of the second signal; and coefficient filter circuitry coupled to the averaging cir-
cuitry and configurable to filter the average of the
number of cycles of the first signal based on a filter
coefficient.

18. The apparatus of claim 17, further comprising noise
detection circuitry coupled to the averaging circuitry and the
coefficient filter circuitry, the noise detection circuitry con-
figurable to:

determine a count difference between an average of the
number of cycles and a filtered number of cycles from
the coefficient filter circuitry; and detect random telegraph noise based on a comparison of
the count difference to a threshold count.

19. The apparatus of claim 18, wherein the noise detection
circuitry is further configurable to set an initial value of the
coefficient filter circuitry to the average of the number of
cycles based on a detection of the random telegraph noise.

20. The apparatus of claim 17, further comprising a
multiplexer configurable to output, to the coefficient filter
circuitry, the number of cycles received from the period
calculator circuitry or the average of the number of cycles
received from the averaging circuitry, wherein the coefficient filter circuitry is configurable to
filter the number of cycles or the average of the number
of cycles based on the filter coefficient.

* * * * *